(12) United States Patent
Sun et al.

(10) Patent No.: US 10,886,736 B2
(45) Date of Patent: Jan. 5, 2021

(54) POST-DISASTER TOPOLOGY DETECTION AND ENERGY FLOW RECOVERY IN POWER DISTRIBUTION NETWORK

(71) Applicant: Mitsubishi Electric Research Laboratories, Inc., Cambridge, MA (US)

(72) Inventors: Hongbo Sun, Lexington, MA (US); Shiva Poudel, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 106 days.

(21) Appl. No.: 16/218,919

(22) Filed: Dec. 13, 2018

(65) Prior Publication Data

US 2020/0195007 A1    Jun. 18, 2020

(51) Int. Cl.
| | |
|---|---|
| *H02J 3/00* | (2006.01) |
| *G06N 3/08* | (2006.01) |
| *G06Q 50/06* | (2012.01) |
| *G01R 19/25* | (2006.01) |
| *G01R 31/08* | (2020.01) |
| *H04L 12/751* | (2013.01) |
| *G05B 19/042* | (2006.01) |

(52) U.S. Cl.
CPC ........ *H02J 3/0073* (2020.01); *G01R 19/2513* (2013.01); *G01R 31/086* (2013.01); *G06N 3/08* (2013.01); *H04L 45/02* (2013.01); *G06Q 50/06* (2013.01); *H02J 3/001* (2020.01); *H02J 2203/20* (2020.01)

(58) Field of Classification Search
CPC .............. G05B 19/042; G05B 19/0428; G01R 19/2513; G01R 31/086; H02J 3/0073; H02J 3/001; H02J 2203/20; G06N 3/08; G06Q 50/06
USPC ....................................................... 700/292
See application file for complete search history.

(56) References Cited

U.S. PATENT DOCUMENTS

| | | | |
|---|---|---|---|
| 2016/0117505 A1* | 4/2016 | Chow ................... | G06F 21/552 726/22 |
| 2018/0374364 A1* | 12/2018 | Kennedy ............... | G06F 11/324 |

\* cited by examiner

*Primary Examiner* — Michael J Brown
(74) *Attorney, Agent, or Firm* — Gennadiy Vinokur; James McAleenan; Hironori Tsukamoto

(57) ABSTRACT

A control system for controlling a power distribution network including a set of devices for providing power commands the devices to reach a consensus on an average of uniquely weighted states of the devices based on iterative exchange of a uniquely weighted state of each device with its neighboring devices. The system determines the values of states of each of the devices corresponding to the received average of uniquely weighted states, determines a new value of the state of at least on device allowing to reroute distribution of the power, and commands to the device to change the state to the new value.

18 Claims, 27 Drawing Sheets

| 212 Switch status | | | 214 Coding Value | 220 Average Value | 228 Restored Code | 222 Decoding | 224 Restore Switch Status | | |
|---|---|---|---|---|---|---|---|---|---|
| $x_1$ | $x_2$ | $x_3$ | | | | | $x_1$ | $x_2$ | $x_3$ |
| 2 | 2 | 2 | $26 = (2 \times 3^2 + 2 \times 3^1 + 2 \times 3^0)$ | 26/3 | 26 | $\frac{26}{3^2} = 2(8), 8/3^1 = 2(2), 2/3^0 = 2$ | 2 | 2 | 2 |
| 2 | 0 | 1 | $11 = (1 \times 3^2 + 0 \times 3^1 + 2 \times 3^0)$ | 11/3 | 11 | $\frac{11}{3^2} = 1(2), 2/3^1 = 0(2), 2/3^0 = 2$ | 2 | 0 | 1 |
| 1 | 1 | 1 | $13 = (1 \times 3^2 + 1 \times 3^1 + 1 \times 3^0)$ | 13/3 | 13 | $\frac{13}{3^2} = 1(4), 4/3^1 = 1(1), 1/3^0 = 1$ | 1 | 1 | 1 |
| 2 | 1 | 0 | $5 = (0 \times 3^2 + 1 \times 3^1 + 2 \times 3^0)$ | 5/3 | 5 | $\frac{5}{3^2} = 0(5), 5/3^1 = 1(2), 2/3^0 = 2$ | 2 | 1 | 0 |
| 0 | 0 | 0 | $0 = (0 \times 3^2 + 0 \times 3^1 + 0 \times 3^0)$ | 0/3 | 0 | $\frac{0}{3^2} = 0(8), 0/3^1 = 0(0), 0/3^0 = 0$ | 0 | 0 | 0 |

FIG. 2D

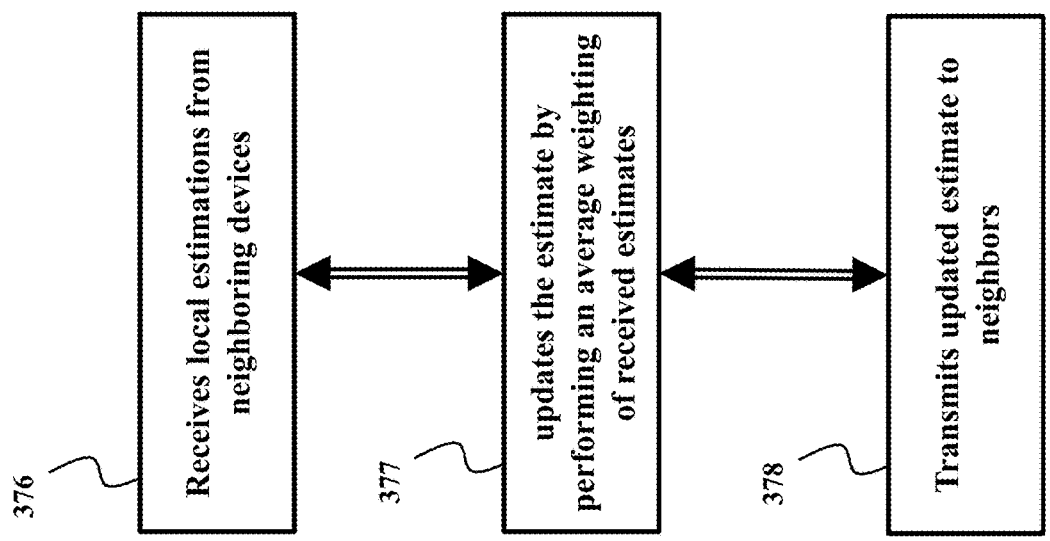

POST-DISASTER TOPOLOGY DETECTION AND ENERGY FLOW RECOVERY IN POWER DISTRIBUTION NETWORK

TECHNICAL FIELD

The present disclosure relates generally to electric power systems, and more particularly to post-disaster topology detection and energy flow recovery in power distribution networks.

BACKGROUND

The electric power grid is one of the most critical infrastructures of a nation; virtually every aspect of a modern society, for instances, transportation, water supply, school, city halls, airports and so on relies on the supply of electricity. Unfortunately, the increased frequency, duration, and intensity of extreme weather events pose severe threats to the power grid causing wide-area power outages primarily affecting in low- and mid-voltage power distribution network. A loss in power supply for an extended period severely affects human well-being, the economy, and national security.

A disaster-resilient power grid is required for the future society which can dynamically adapt its configuration to mitigate disasters' impacts, self-learn and identify connectivity based on local measurement, and recover from these high impacts but less probability events rapidly. After a disaster occurs, the topology connectivity detection is the first but crucial step for service restoration. Commonly, the communication system to central controller is failed, and the power grid has to rely on the distributed metering point's local measurement to identify its connectivity. Outages are generally caused in the electric power grid by a protective device closing off a part of the network to isolate fault within the system. The term outage detection is essentially finding the status of breaker or recloser and switches. An efficient outage detection method could help to reduce the outage duration dramatically, thus reducing outage cost and meeting customers' expectation.

Power distribution networks are distinguished with power transmission networks (i.e. main grid) by radial configuration, i.e. tree-topology. Due to one-way flows of power, they have less monitoring, observability and state estimation as compared to transmission networks. Traditionally, its outage detection is based on customer trouble call method. There are some non-trouble call based methods disclosed recently to identify the topology of the power distribution network after an outage. For example, US patent application US20130035885A1 discloses a statistical technique to estimate the status of switching devices in distribution networks, using limited or non-redundant measurements. Using expected values of power consumption, and their variance, the confidence level of identifying the correct topology, or the current status of switching devices, is calculated using any given configuration of real time measurements. Different topologies are then compared in order to select the most likely topology at the prevailing time.

Another example is given in US patent application US20130116946A1, in which the methods and apparatus are disclosed for determining power distribution system topology using disturbance detection. A disturbance is generated in at least a portion of the power distribution network. At least one node of the network experiencing the disturbance is identified and a topology of the power distribution network is determined responsive to identifying the at least one node. The at least one node may be identified by detecting a voltage-related artifact corresponding to the disturbance. A phase-locked loop-based circuit may be used for fast artifact detection. Groups of devices in the network may be identified from the artifacts, and combinatorial optimization techniques may be used to determine connectivity within such groups.

Still another example is US Grant U.S. Pat. No. 5,568,399A, the method and apparatus are provided for determining distribution system information based on the power distribution grid. For each report that is thereafter received of a new power outage, a set of protective devices that possibly operated in response to the fault is identified by upstream tracing from the terminal node to the power source. Using fuzzy set theory, the possibility that each protective device operated is calculated. The cumulative possibility that each protective device operated is then calculated by summing the possibilities associated with unflagged reports for each protective device. This cumulative possibility is compared to a predetermined confidence threshold associated with each protective device. If the cumulative possibility that a given protective device operated is greater than the confidence threshold, a conclusion is reached that the protective device operated, and all reports that led to that conclusion are flagged so as not to contribute to future outage determinations. If the conclusion is subsequently rejected, the reports that led to the rejected conclusion are unflagged so as to contribute to future outage determinations.

The aforementioned methods, however, has some limitations. Traditional methods based on trouble calls depends on the availability of trouble call from the customer side and absence of customer might prolong the outage detection and as a result, the overall restoration action will be prolonged. Majorities of non-trouble call based methods are focused on identifying the correct topology of power distribution system during normal conditions and such methods are inapplicable for disastrous events. Some of the existing methods formulates the outage detection as a combinatorial problem and apply heuristic search based methods which are computationally expensive. Other are based on assumption that a sensor or a smart meter has the communication capability with utility center, and the outage is detected based on the collected information. However, these methods are prone to single-point failure and rely on a communication over large range.

These drawbacks may preclude a rapid post-disaster recovery of power distribution system. Accordingly, there is still a need for a method for post-disaster topology detection that allows a rapid energy flow recovery in power distribution systems.

SUMMARY

The present disclosure relates generally to electric power systems, and more particularly to post-disaster topology detection and energy flow recovery in power distribution systems.

The present disclosure relates to systems and methods for detecting topology connectivity of a disaster-damaged power distribution network. It is based on a recognition that for a power distribution network, the measurement and sensing units equipped with switching devices are widely used in the power distribution network, but these units also have capability of a limited range for communication. Therefore, there is a need for detecting the topology connectivity through limited local communications between these devices. Thus, a costly and time-consuming centralized communication can be avoided.

Some embodiments are based on realization that an average consensus protocol can be used to evaluate a global state of a power distribution system using only local communications between neighboring devices. As used herein, two devices with direct communication capability are neighbors. In other words, the two devices are connected by one hop wired or wireless communication link. In general, in computer science, "consensus" refers to reaching an agreement regarding a certain quantity of interest that depends on the state of all agents. The consensus protocol determines quantity of interest as a weighted combination of quantities of neighboring devices. In that sense, the consensus protocol requires only local communication. However, if the weights are uniquely selected, the resulted average state will be unique for different combinations of states of the devices. In such a manner, consensus protocol can be used to encode information of the global states of different devices indicative of topology of the power distribution systems.

The average consensus protocol is an iterative distributed method with a guarantee for asymptotical converge, and calculates the average of local values stored at the devices, i.e., nodes, of the network. Each node maintains a local estimate of the average and, at every iteration, it sends its estimate to all its neighbors and then updates the estimate by performing an average weighted of the estimates received. The operator or controller of the distribution network can assess to any of these agents to get the average weighted, and derive the correct topology connectivity from the average weighted, if the average is devised wisely to uniquely represent the combination of statuses of all switching devices.

For example, let say a power distribution system includes two identical switches having ON or OFF states. Typically, the values of the same states of those switches are associated with the same numbers, e.g., 1 for the ON state and −1 for the OFF state. Hence, different switches having the same state would be associated with the same number. However, some embodiments are based on realization that each state of each device can have a unique weight. For example, a first switch can have a weight equal 13 for the ON state and a weight equal 25 for the OFF state, while the second switch can have can have a weight equal 4 for the ON state and a weight equal 37 for the OFF state. In such a manner, the combination of different states of different switches is also a unique number. Hence, such a combination can be used to encode the global state of different devices. Notably, different weighting schemes are used by different embodiments to obtain whole network connectivity model through detecting status of each switching device sequentially, or concurrently.

Some embodiments use the consensus protocol to recover this combination encoding global information using only local communication with guarantee for asymptotical convergence. In addition to local communication, the results of the consensus protocol are independent from communication topology and thus advantageous to post-disaster topology detection. To that end, a consensus on an average of uniquely weighted states of the devices based on iterative exchange of a uniquely weighted state of each device with its neighboring devices can provide almost real-time evaluation of the states of the devices allowing to change the state to redistribute the energy flow in power distribution system.

Additionally, or alternatively, at least one realization of the present disclosure included that the topology detection for a practical power distribution network requires an effective and robust communication topology for the exchange of information among agents under disaster situations. However, the traditional communication network with radial configuration lacks sufficient resilient to link faults and its convergence performance is not good enough either. The fast topology detection of the power distribution network is achieved by distributing the average consensus algorithm into sub-graphs and hence the system damage model is obtained at a relatively small amount of time with the less computational burden. An efficient and robust communication graph is modeled for each area.

Local agents in each area utilize the communication graph for running the consensus algorithm. The present disclosure is thus suitable for practical implementations during a disaster as it relies on local measurements and local communication. The communication network for each area is optimizing by adding additional communication links to the base communication topology according to their contributions to the algorithm convergence and network robustness and constraints of agent communication range and capacity and network budget.

Yet another realization of the present disclosure included that the communication network needs to withstand reasonable communication link failures for ascertaining reliable topology detection for the distribution network. The disclosed average consensus based communication framework is robust to the random link failures through dynamic weighting and hence the convergence is guaranteed during a disaster condition. The present disclosure can be used combined with an efficient restoration algorithm to assess the system damage after a disaster, and determine valid topology reconfiguration to maximally restore the critical loads and non-critical loads.

Accordingly, one embodiment discloses A control system for controlling a power distribution network including a set of devices for providing power, the devices include one or combination of a breaker, a recloser, and a sectionizing switch, and a tie-switch. The control system includes a transmitter configured to command the devices to reach a consensus on an average of uniquely weighted states of the devices based on iterative exchange of a uniquely weighted state of each device with its neighboring devices; a receiver configured to receive, in response to transmitting the command, the average of uniquely weighted states of the devices; a memory configured to store information indicative of a mapping between values of the average of uniquely weighted states of the devices and values of states of each of the devices; and a processor programmed to determine, using the mapping, the values of states of each of the devices corresponding to the received average of uniquely weighted states; determine, based on the values of states, a new value of the state of at least on device allowing to reroute distribution of the power; and command to the device to change the state to the new value.

Another embodiment discloses a method for controlling a power distribution network including a set of devices for providing power, the devices include one or combination of a breaker, a recloser, and a sectionizing switch, and a tie-switch, wherein the method uses a processor coupled with stored instructions implementing the method, wherein the instructions, when executed by the processor carry out steps of the method including commanding the devices to reach a consensus on an average of uniquely weighted states of the devices based on iterative exchange of a uniquely weighted state of each device with its neighboring devices; receiving, in response to transmitting the command, the average of uniquely weighted states of the devices; retrieving information indicative of a mapping between values of the average of uniquely weighted states of the devices and values of states of each of the devices; determining, using the mapping, the values of states of each of the devices corresponding to the received average of uniquely weighted states; determining, based on the values of states, a new value of the state of at least on device allowing to reroute distribution of the power; and commanding to the device to change the state to the new value.

Yet another embodiment discloses a non-transitory computer readable storage medium embodied thereon a program executable by a processor for performing a method for controlling a power distribution network including a set of devices for providing power, the devices include one or combination of a breaker, a recloser, and a sectionizing switch, and a tie-switch. The method includes commanding the devices to reach a consensus on an average of uniquely weighted states of the devices based on iterative exchange of a uniquely weighted state of each device with its neighboring devices; receiving, in response to transmitting the command, the average of uniquely weighted states of the devices; retrieving information indicative of a mapping between values of the average of uniquely weighted states of the devices and values of states of each of the devices; determining, using the mapping, the values of states of each of the devices corresponding to the received average of uniquely weighted states; determining, based on the values of states, a new value of the state of at least on device allowing to reroute distribution of the power; and commanding to the device to change the state to the new value.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 2D is a schematic illustrating an exemplar coding and decoding steps for identifying switch statuses, according to some embodiments of the present disclosure;

FIG. 3H is a block diagram of a consensus protocol performed by a device for providing power according to one embodiment.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The increased frequency, duration and intensity of extreme weather events pose severe threats to the power grid causing an increase in wide-area power outages especially in a power distribution system. This calls for ensuring a resilient operation by quickly restoring the critical services during natural disasters. An accurate situational awareness of the power distribution grid is essential beforehand to make any decisions regarding restoration. Commonly, the communication of central controller with several smart meters and sensors might be failed due to disaster.

The presents disclosure discloses a method for obtaining the damage model, i.e. connectivity of a power distribution system based on consensus protocol. The measurement and sensing units in the distribution network are modeled as an agent with limited communication capability that exchanges the information, i.e. switch status to reach an agreement in a consensus algorithm. The switch status is weighted through a deliberated devised coder for generating initial status of corresponding agent, such that the average weighted status of all agents uniquely representing the combination of all switch statuses. After the average consensus process is converged, the switch status is reproduced for each switch by a decoder from the converged average weighted status. In some implementations, a communication graph is designed for agents to run the consensus protocol which is efficient and robust during the disaster event. Agents can dynamically communicate with the other agents based on available links that are established and solve the distributed consensus algorithm quickly to come up with the correct topology of power distribution system. A restoration method can be called after the topology is identified for restoring the critical loads.

Figure 1A:
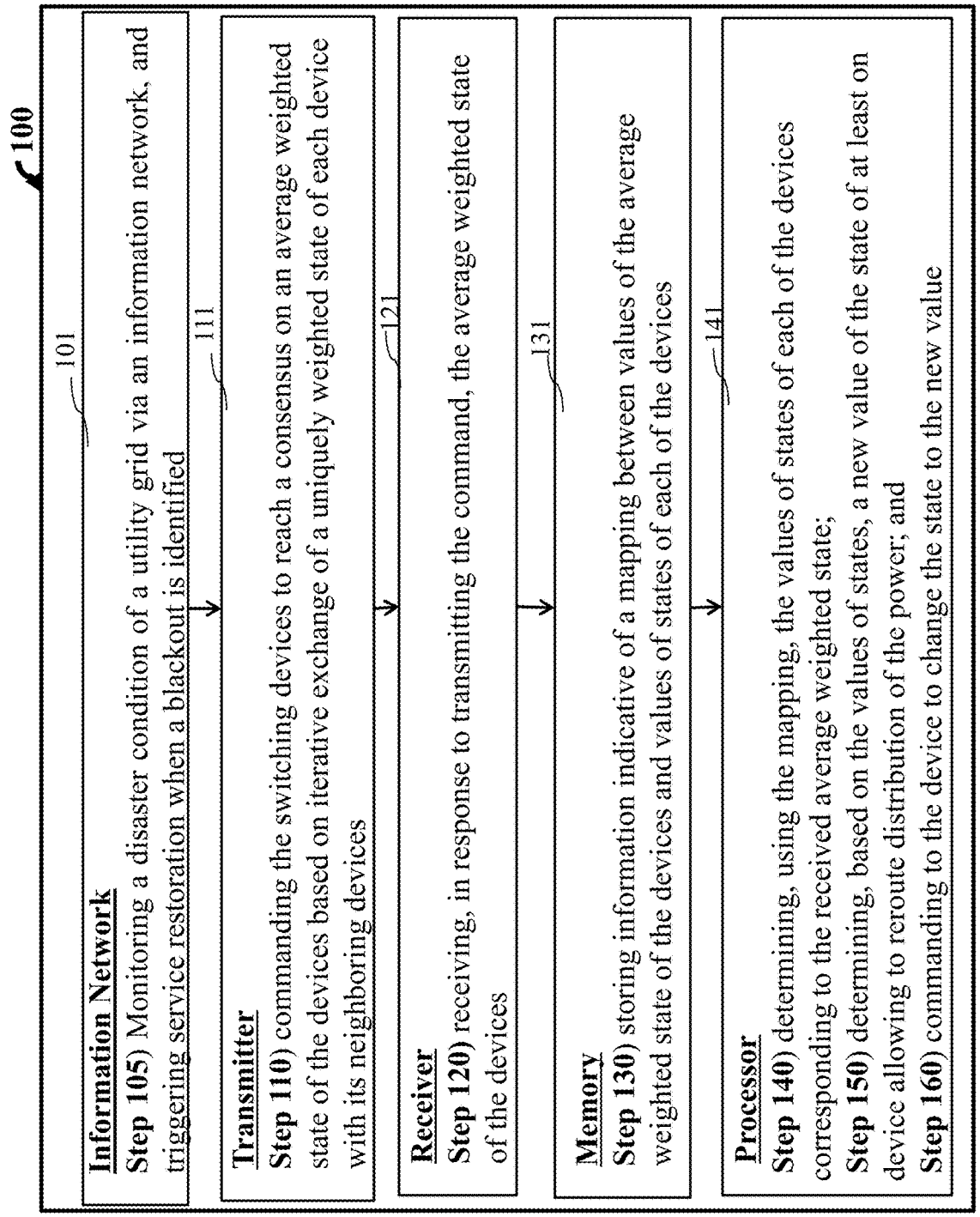
FIG. 1A is a block diagram illustrating a method for detecting topology of a power distribution network, according to embodiments of the present disclosure.

FIG. 1A is a block diagram illustrating a method 100 for detecting topology connectivity of a power distribution network, according to some embodiments. The embodiments monitor 105 a disaster condition of a utility grid via an information network 101, and trigger service restoration when a blackout is identified.

The embodiments use 110 a transmitter 111 to command the devices for providing power to reach a consensus on an average of uniquely weighted states of the devices based on iterative exchange of a uniquely weighted state of each device with its neighboring devices. The embodiments receive 120, via a receiver 121 in response to transmitting the command, the average of uniquely weighted states of the devices. The embodiments access 130 information stored in a memory 131, indicative of a mapping between values of the average of uniquely weighted states of the devices and values of states of each of the devices.

The embodiments use a hardware processor 141 configured to determine 140 using the mapping, the values of states of each of the devices corresponding to the received average of uniquely weighted states, determine 150 based on the values of states, a new value of the state of at least on device allowing to reroute distribution of the power; and command 160 to the device to change the state to the new value.

Some embodiments of the present disclosure provide unique aspects, by non-limiting example, using a weighted state as initial value for each switching device, such that an average of uniquely weighted states is derived to unquietly represent the combination of statuses of all switching devices, and thus the operator of the distribution network can acquire the whole network's connectivity topology by accessing any of switching device after run an average consensus algorithm. After the status for each switching device is obtained, the operator of the distribution network can devise the service restoration scheme by adjusting the statuses of the switching devices to build valid paths from available generation sources to the loads through connectivity analysis and power flow analysis.

Figure 1B:
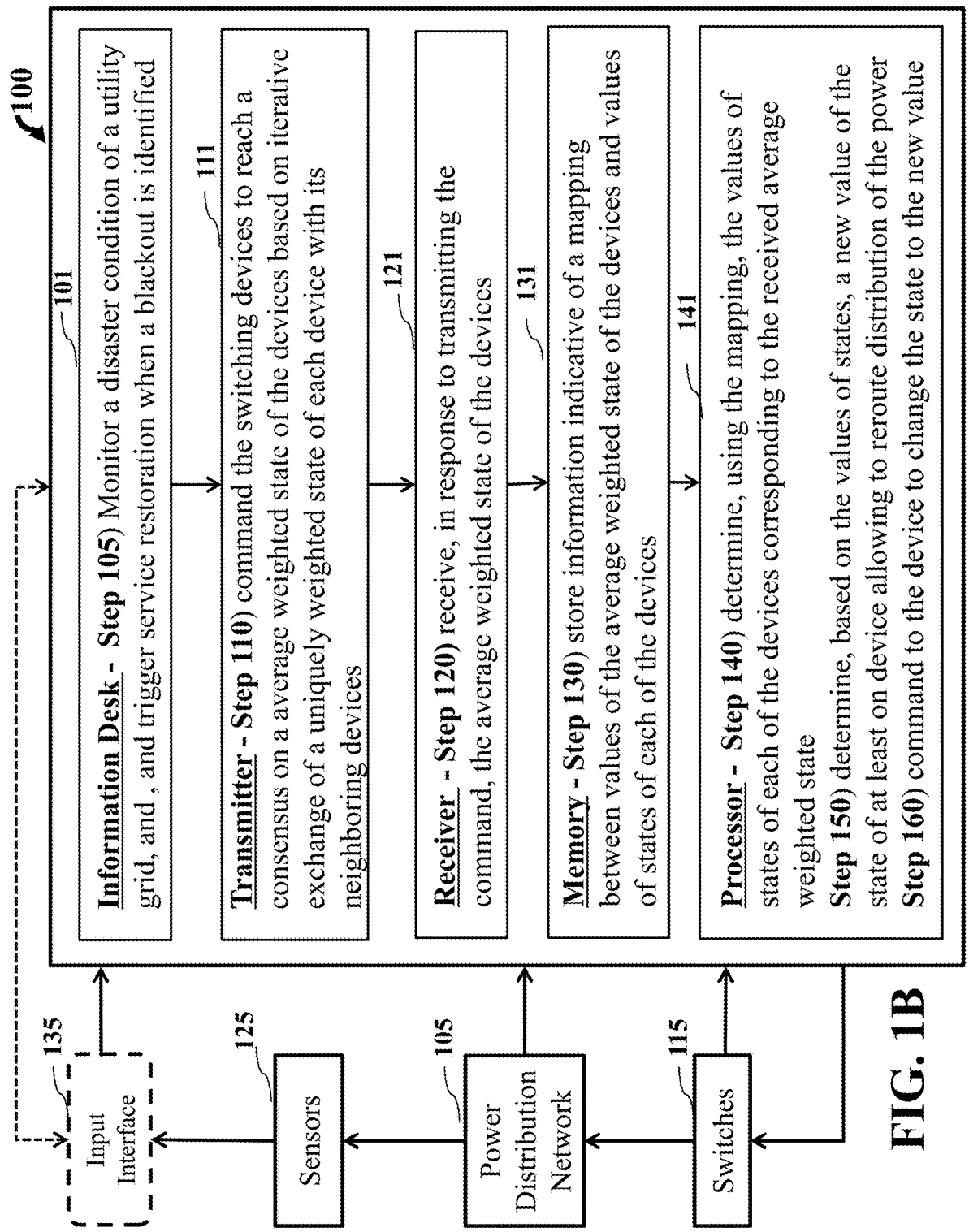
FIG. 1B is a block diagram illustrating the system of FIG. 1A, implemented using some components of the system, according to embodiments of the present disclosure.

FIG. 1B is a block diagram illustrating the system of FIG. 1A, wherein the system is implemented using some components, according to embodiments of the present disclosure. FIG. 1B can include a hardware processor 141 in communication with an input interface 135, a memory 131, an information network 101, a transmitter 121. The processor 141 can be connected to the set of switches 115 that installed in the power distribution network 105. The power distribution network can have a set of sensors or meters 125 to monitor the condition information of the network 105. The control system 100 can control the set of switches 115 as well as can send and receive information. It is contemplated the hardware processor 141 can include two or more hardware processors depending upon the requires of the specific application. Certainly, other components may be incorporated with method 100 including input interfaces, output interfaces and transceivers.

Still referring to FIG. 1B, aspects of the system 100 include step 105 of monitoring a disaster condition of a utility grid via an information desk 101, and triggering service restoration when a blackout is identified. Step 110 includes commanding the switching devices, via a transmitter to reach a consensus on an average of uniquely weighted states of the devices based on iterative exchange of a uniquely weighted state of each device with its neighboring devices. Step 120 includes receiving, via a receiver in response to transmitting the command, the average of uniquely weighted states of the devices. Step 130 includes storing in a memory the information indicative of a mapping between values of the average of uniquely weighted states of the devices and values of states of each of the devices. Step 140 includes determining, using the mapping, the values of states of each of the devices corresponding to the received average of uniquely weighted states. Step 150 includes determining, based on the values of states, a new value of the state of at least on device allowing to reroute distribution of the power. Step 160 includes commanding to the device to change the state to the new value.

Figure 1C:
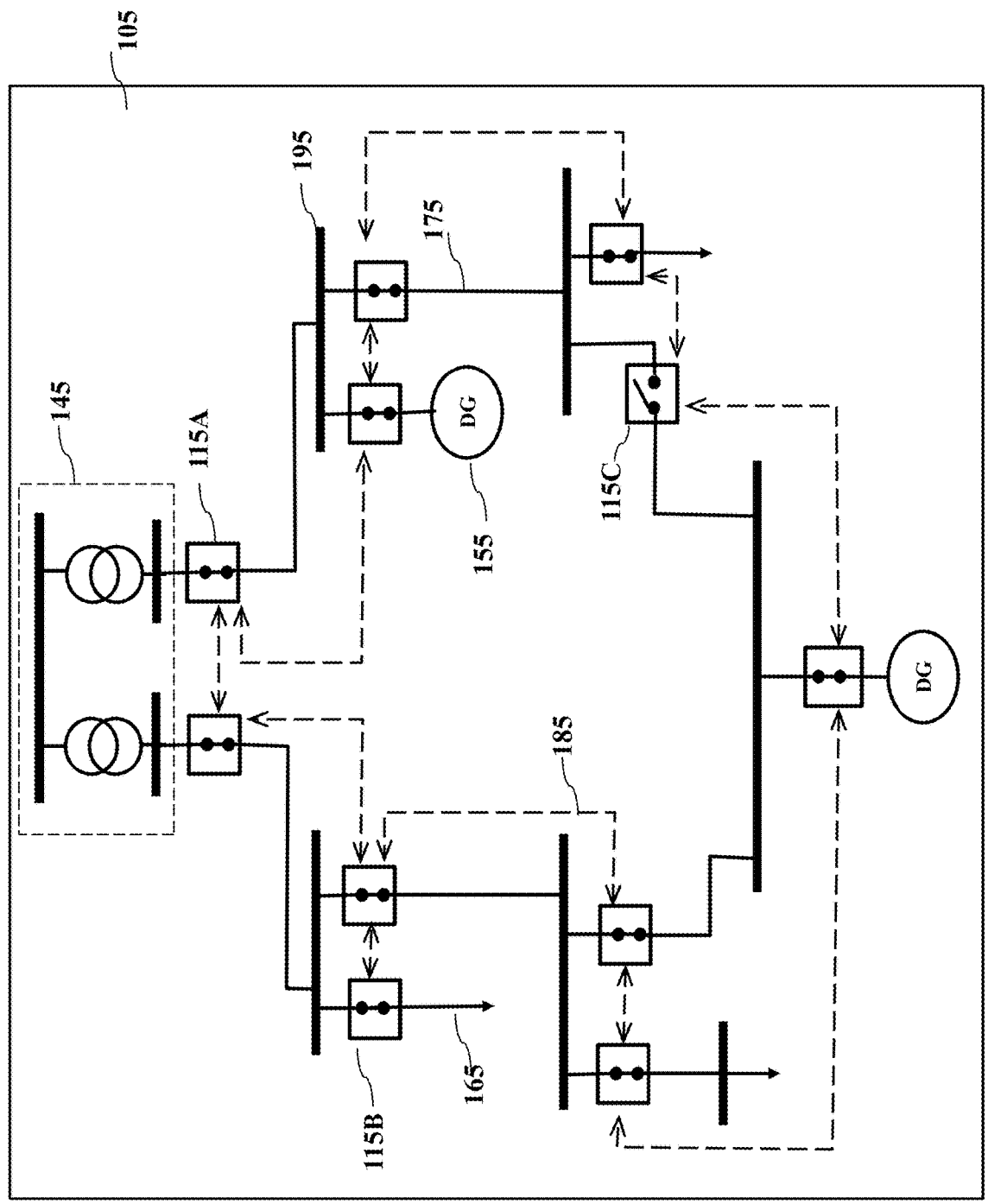
FIG. 1C is a schematic illustrating the components of power distribution network and the relationship between the components of the network, according to some embodiments of the present disclosure.

FIG. 1C is a schematic illustrating the components of power distribution network and the relationship between the components of the network, according to some embodiments of the present disclosure. A power distribution network of some embodiments include a set of devices for providing power. Example of the devices include one or combination of a breaker, a recloser, and a sectionizing switch, and a tie-switch. Each device has multiple states, and each state of each device is associated with a unique weight thereby encoding the state of the entire network.

The power distribution network 105 is operated by a distribution control system 100. It transfers the powers supplied by the generation plants, i.e. sources, 145 and 155 to the power customers, i.e. loads 165 through distributions lines 175. The generation sources can include a main grid 145, and various distribution generations sources, 155 including dispatchable generators (e.g. micro-turbines), non-dispatchable generators (such as photovoltaic or wind turbine), and energy storage system (such as battery). Each distribution line 175 is connected with two buses 195, and each bus can be connected with generation sources, power customers and other lines. The distribution system is normally fed by the main grid through a substation, 145. Both the main grid and the distribution grid can be part of the utility grid. The distribution control system can also be included into the control system for the utility grid.

Still referring to FIG. 1C, the connectivity of the power distribution network is determined and adjusted by the states of switching devices 115A and 115B in the system. The switching devices may include a circuit breaker, a recloser, and a switch. The switching device can be closed 115A or be opened 115B remotely by the distribution control system (DCS) 100 with bi-way communication links 185. A normally closed switch is usually called sectionizing switch, and a normally opened switch called tie switch. Those switching devices are commonly equipped with additional measurement units or sensors to send back switch statuses, switch terminal voltages, and power flows through the devices to the DCS 100. In addition, there are also sensors 135 installed within the network for helping monitoring the conditions of the system. Those sensors can be a phasor measurement unit (PMU), a remote terminal units (RTU), a fault indicators (FI), a fault disturbance recoders (FDR) and other devices that can communicate with the DCS 100 via one-way or two-way communication links 185. One embodiment of the present disclosure detects the states of switching devices through device neighborhood communications, and then determines which customers are lost, which generation sources are available, and which restoring paths are available to restore the services for the customers with given generation capacities.

Topology Detection Using Average Consensus Protocol

In some embodiments, the topology detection is achieved using an average consensus protocol. Some embodiments use average consensus protocol that are more suitable and effective for power distribution network experiencing a major disaster, when the weighted states for devices are uniquely configured, such that the network connectivity can be represented using an average of uniquely weighted states.

Consensus and cooperation problems are in the domain of computer science from early years and they form the foundation of the field of distributed computing. In network of several agents, "consensus" refers to reach an agreement regarding a certain quantity of interest that depends on the state of all agents. To identify the healthy portion of damaged network, the quantity of interest could be switch status or line flow measurements.

A physical distribution network can be modeled as a graph $G_{ph}(V, E_{ph})$ with set of buses or nodes V=1,2,3, ... , n and set of edges $E_{ph} \subset V \times V$. Similarly, the communication network among agents can be modeled as a graph $G_{cm}(V, E_{cm})$ with same set of nodes as in physical system and set of communication links $E_{cm} \subset V \times V$. $E_{ph}$ and $E_{cm}$ can be same or $E_{cm}$ can have more links than distribution lines to increase the system redundancy and for faster convergence in the consensus algorithm. Being a radial network and having relatively less degree of a node, $|E_{ph}| \ll |V \times V|$. Let $N_i$ be the neighbors of agent i and are given as:

$$N_i = \{j | (i,j) \in E_{ph}\}$$

The topology of the graph is characterized by the adjacency matrix $A = \{a_{ij}\}$ where $a_{ij}=1$ if $(i, j) \in E$, and $a_{ij}=0$ otherwise. Suppose a degree matrix, D is defined as:

$$D = \text{diag}[\deg_1, \deg_2, \ldots, \deg_n]$$

Where the diagonal element represents the degree of a particular node given by, $\deg_i \Sigma_{i \neq j} a_{ij}$. At this point it is noteworthy to define the graph Laplacian matrix L with eigenvalues $\lambda_1, \lambda_2, \ldots, \lambda_N$, which is given in equation (1):

$$L = D - A. \tag{1}$$

According to the definition of graph laplacian, all row-sums of L are zero because of $\Sigma_j L_{ij} = 0$. Therefore, L always has a zero eigenvalue $\lambda_1 = 0$, and this zero eigen-value corresponds to the eigenvector $1 = (1, \ldots, 1)^T$. From the spectral graph theory, it is known that second smallest eigenvalue of the Laplacian matrix L can tell much information about the graph and also the behavior of the average consensus algorithm. The performance of consensus algorithms often depends on $\lambda_2(L)$, which is also known as algebraic connectivity.

A linear iterative form of the consensus protocol cab be formulated to update the information state of each node according to:

$$x_i(k+1) = w_{ii} x_i(k) + \Sigma_{j \in N_i} w_{ij} x_j(k), \tag{2}$$

Where, $x_i$ is the state of node i which can be a switch status, or a level of power flow on the distribution line. $N_i$ is the neighbors of node i, i.e. the set of nodes that can transmit information to node i directly. $w_{ij}$ is the weight of link between node i and node j. The selection of weight $w_{ij}$ determines the convergence rate of the algorithm and hence it should be chosen intelligently. With the exception of diagonal entries, setting $w_{ij}=0$ for $j \notin N_i$, above equation (2) can be re-written as:

$$x(k+1) = Wx(k), \tag{3a}$$

$$x(k+1) = x(k) - \in Lx(k), \tag{3b}$$

Where $W = I - \in L$, $\in$ represents the step size for iteration. With the proper value of step size and required tolerance, the value of x(k) will converge to the average of their initialized values.

$$\lim_{k \to \infty} x(k) = \lim_{k \to \infty} Wx(0) = \frac{1}{n} 11^T x(0), \tag{4}$$

Where, 1 denotes vector of all ones, and n is the number of agents in a network.

Since the algorithm converges to the average of the initialized values, the average value can be used to represent the network topology if proper initialization is done for each node.

Sequential Topology Detection Approach Using Average Consensus

The network topology can be detected by identifying the status for each switch sequentially. For each switch, an average consensus protocol can be run once by setting the initial status for nodes as follows:

$$x_i(0) = \begin{cases} ns_i & \text{if } i \text{ is the chosen node} \\ 0 & \text{otherwise} \end{cases}$$

Where, and $s_i$ is the information each agent carrying. For example, $s_i$ can set as 1 if the corresponding switch is on, and −1 if the switch is off.

Due to large number of switches in a distribution network, it is quite time-consuming to use a sequential approach to detect the whole topology of the distribution network.

Simultaneous Topology Detection Approach Using Average Consensus

The network topology can alternatively be detected by using a simultaneous approach, that is all switches' statuses are determined through run an average consensus once. However, the challenge is how to design the weighting scheme for each node to enable the average representing the combination of switch statuses uniquely.

Figure 2A:
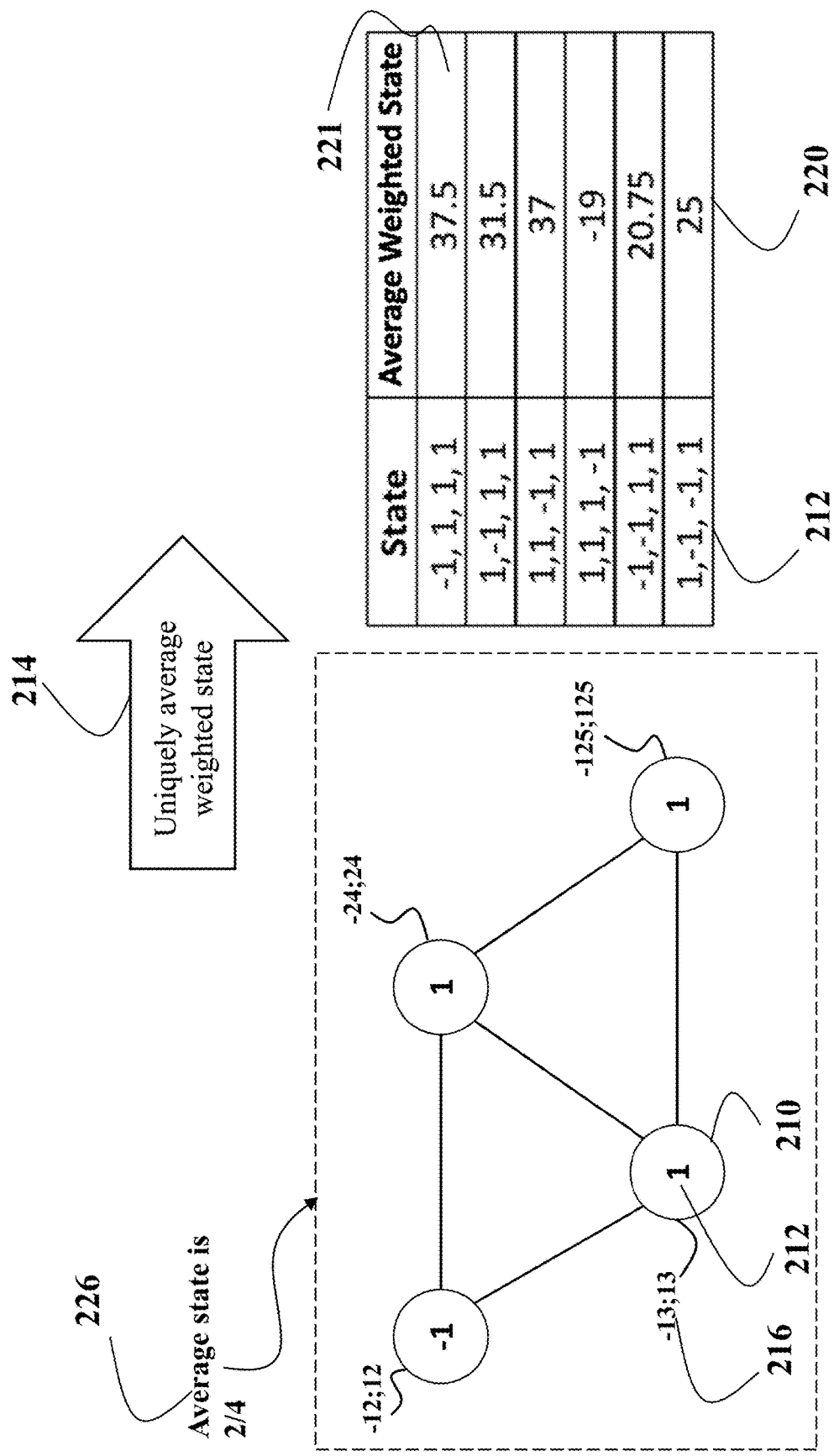
FIG. 2A is a schematic illustrating the relationships between switch states and uniquely average of uniquely weighted states using average consensus protocol, according to some embodiments of the present disclosure.

FIG. 2A is a schematic illustrating the conceptual relationships between switch states and average of uniquely weighted states using average consensus protocol, according to some embodiments of the present disclosure. An example of FIG. 2A shows a network with 4 switches represented as nodes 210. Each node 210 has an original state 212 that represents a physical state of the switch, such as 1 for ON state, and −1 for OFF state. If the original states are used, the average state for the network will be 2/4 which are not be unique with respect to the combination of the statuses of all switches in the network. Therefore, instead of directly use the original one initialize the node state, a weighted state 216 is used to set the initial value of node state, and this step is called state coding 214 in the present disclosure. This weighted state is selected to ascertain the average of weighted states, 220 for all switches unique for a given combination of switch statuses.

The mapping between the switching devices' statuses 212 and the average of uniquely weighted states 220 can be saved in a memory, e.g., in a lookup table 221. It can also be used to train a neural network to explicitly model the relationship between the combination of states of the switches 212 (as outputs of neural network) and the average of uniquely weighted states 220 (as inputs of neural network) that can be further used to identify the states for each switch when an average of uniquely weighted states is given.

After the average of weighted state is obtained, the status for each switching device can be determined based on the stored mapping between status combination and average weighted, or using the trained neural network with the average weighted as given inputs. This reproducing switch status step is called state decoding in this disclosure.

Figure 2B:
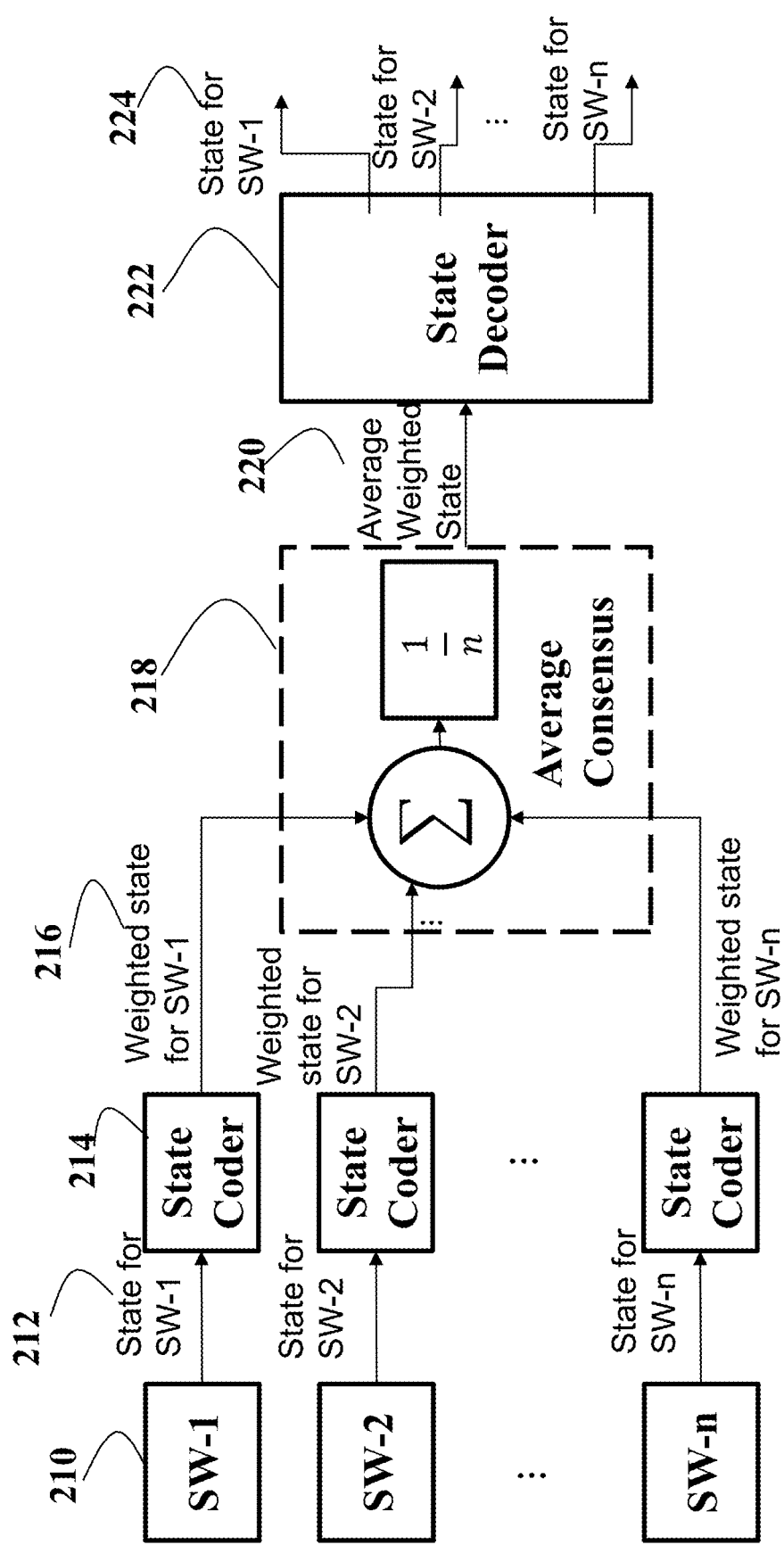
FIG. 2B is a schematic illustrating the steps for identifying switch states using average consensus protocol, according to some embodiments of the present disclosure.

FIG. 2B is a schematic illustrating the steps for identifying switch states using average consensus protocol, according to some embodiments of the present disclosure. In FIG. 2B, the state for each switch 210, 212 is first converted into a uniquely weighted state 216 through a state coder. As used herein, the weighted state is unique if its value is not assigned to any other state of any other devices participating in a consensus protocol. Then an average consensus protocol 218 is run by taking these weighted states as initial values for nodes. The converged value for average of uniquely weighted states 220 is then fed into a state decoder to determine the actual status for each switch respectively.

Figure 2C:
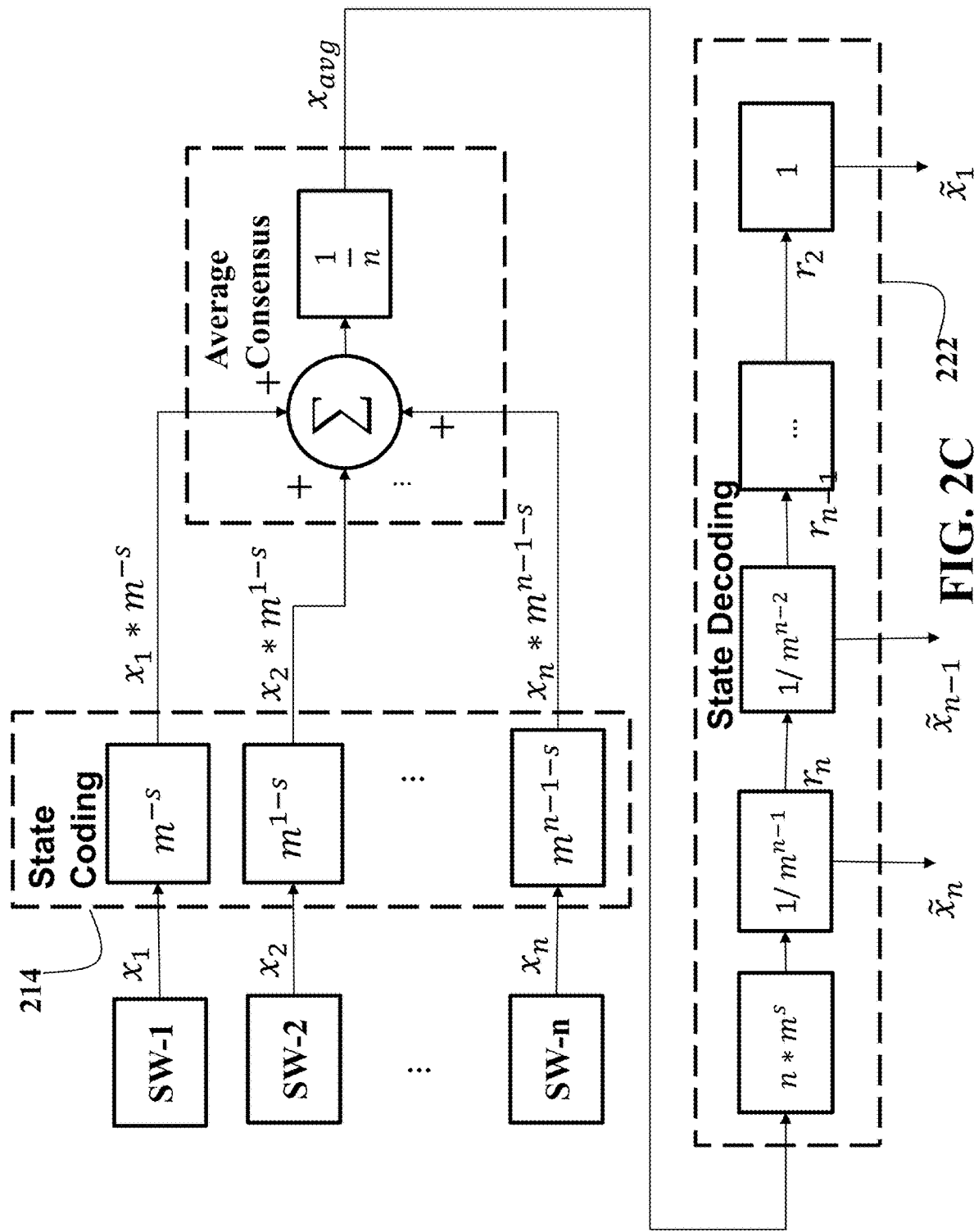
FIG. 2C is a schematic illustrating the steps for coding and decoding switch statuses using average consensus protocol, according to some embodiments of the present disclosure.

There are many ways to design the state coder and state decoder based on the characteristics of the application. FIG. 2C gives an exemplar way to code and decode the switch statuses using average consensus protocol according one embodiment.

In FIG. 2C, there are n nodes, i.e. switches ordered by its series number. The original state of node i, $x_i$ is weighted by a factor of $$\frac{m^{i-1}}{m^s}$$

through a state decoder 214, where m is the total number of status variation for each node, s is the number multiplier used for scaling the status values. The domain of $x_i$ is $\{0,1,2, \ldots, m-1\}$. This embodiment provides a systematic approach for determining unique weights and decoding the states of the devices.

The average of uniquely weighted states obtained from average consensus process is passing through a state decoder 222 to reproduce into each switch's status. The average of uniquely weighted states is first multiplied by $m^s n$ to get an unscaled state sum. This unscaled state sum is divided by $m^{-1}$, and the resultant quotient is the status for the n-th switch $x_n$, and the reminder $r_n$ is further decoding by dividing $m^{-2}$ to reproduce the state for the next switch, $x_{n-1}$. This process stops until all switch statuses are reproduced.

FIG. 2D is a schematic illustrating a set of coding and decoding examples using the method given in FIG. 2C to identifying switch statuses, according to some embodiments of the present disclosure. In FIG. 2D, each switch has 3 status, and total number of switches is 3, the status for i-th switch is set as: $3^{i-1}*x_i$, $x_i=\{0,1,2\}$, $i=\{1,2,3\}$. The weighed states for switches SW1, SW2, and SW3 are set as $3^0*x_1$, $3^1*x_2$, and $3^2*x_3$. These values are averaged 220 through an average consensus process, and the resulted average is then decoded 222 to reproduce the status for each switch. There are four examples for different switch status combination. For example, for a combination of $\{2,2,2\}$, each switch gets its corresponding weighted state with respect to its series order and original state respectively. In this case, the weighted states for SW1, SW2 and SW3 are 2, 6, and 18, respectively. The converged average is 26/3, and total initial sum is 26. Based on the total initial sum, the statuses for SW3, SW2 and SW1 are reproduced as 2, 2, and 2 successfully.

Exemplar Embodiments

Figure 3A:
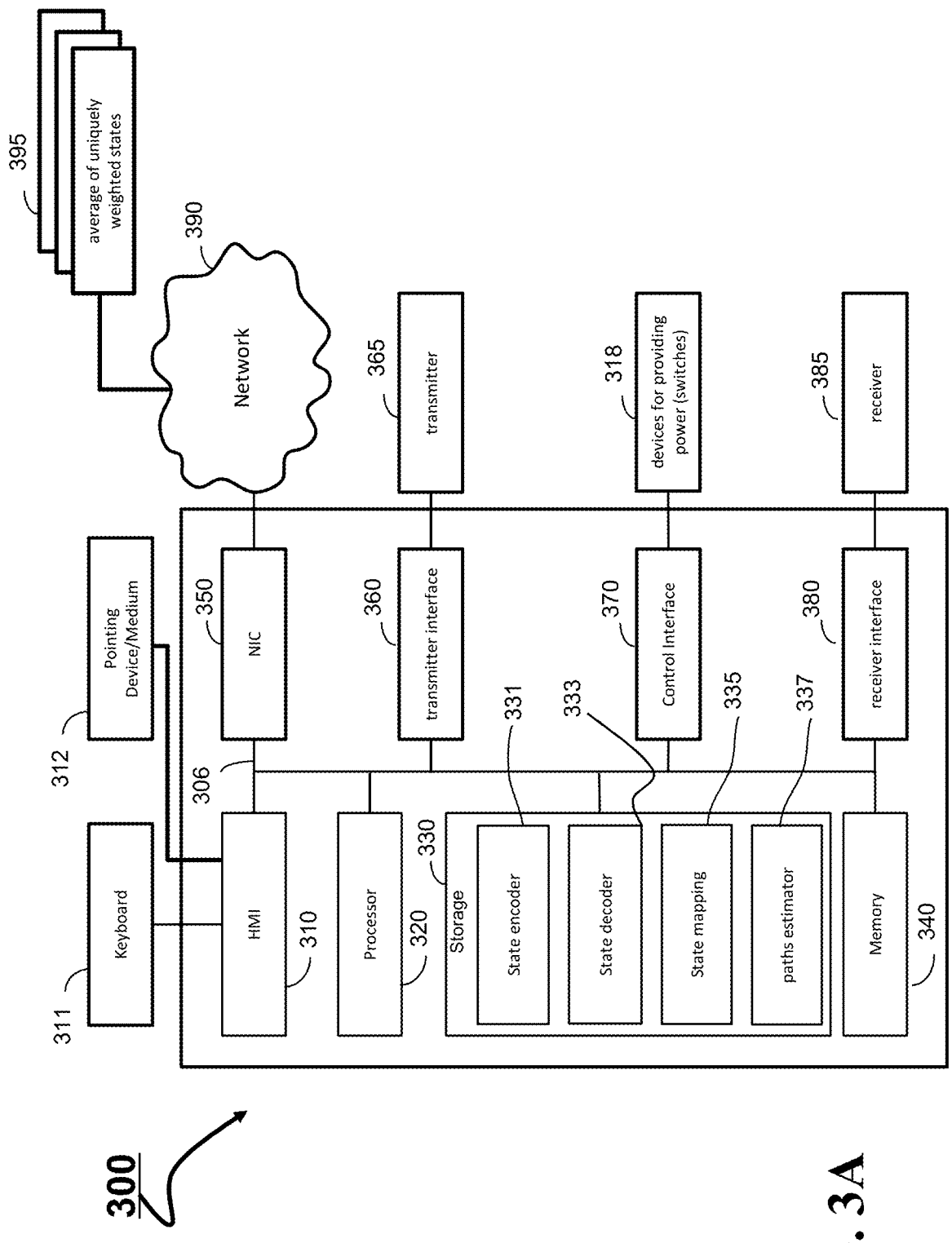
FIG. 3A is a block diagram of a control system for controlling a power distribution network including a set of devices for providing power in accordance with some embodiments.

FIG. 3A shows a block diagram of a control system 300 for controlling a power distribution network including a set of devices for providing power in accordance with some embodiments. Examples of devices include one or combination of a breaker, a recloser, and a sectionizing switch, and a tie-switch. Each device has multiple states associated with a unique weight and at each instance of time, each device is in one of its possible states. The control system 300 uses an average of uniquely weighted states of the devices to estimate the state of the devices and use the estimated states of the devices to direct the energy flow in the power distribution network.

The control system 300 can have a number of interfaces connecting the system 300 with other systems and devices. A network interface controller 350 is adapted to connect the system 300 through the bus 306 to a network 390 connecting the control system 300 with the devices 318 of the power distribution network. For example, the control system 300 includes a transmitter interface 360 configured to command, using a transmitter 365, the devices 318 to reach a consensus on an average of uniquely weighted states of the devices based on iterative exchange of a uniquely weighted state of each device with its neighboring devices. Through the network 390, using a receiver interface 380 connected to a receiver 385, the system 300 can receive the average 395 of uniquely weighted states of the devices. Additionally, or alternatively, the control system 300 includes a control interface 370 configured to transmit commands to the devices to change their states. The control interface 370 can use the transmitter 365 to transmit the commands and/or any other communication means.

In some implementations, a human machine interface 310 within the system 300 connects the system to a keyboard 311 and pointing device 312, wherein the pointing device 312 can include a mouse, trackball, touchpad, joy stick, pointing stick, stylus, or touchscreen, among others. The system 300 includes an output interface configured to output the topology of the power distribution network. For example, the output interface can include a memory to render the topology and/or various interfaces to system benefiting from knowing the topology. For example, the system 300 can be linked through the bus 306 to a display interface adapted to connect the system 300 to a display device, such as a computer monitor, camera, television, projector, or mobile device, among others. The system 300 can also be connected to an application interface adapted to connect the system to equipment for performing various power distribution tasks.

The system 300 includes a processor 320 configured to execute stored instructions, as well as a memory 340 that stores instructions that are executable by the processor. The processor 320 can be a single core processor, a multi-core processor, a computing cluster, or any number of other configurations. The memory 340 can include random access memory (RAM), read only memory (ROM), flash memory, or any other suitable memory systems. The processor 320 is connected through the bus 306 to one or more input and output devices. These instructions implement a method for post-disaster topology detection and energy flow recovery in power distribution networks.

To that end, the control system 300 includes a state encoder 331 configured to determine and assign unique weights for each state of each device 318 forming the power distribution network and/or command the devices 318 to reach a consensus on an average of uniquely weighted states of the devices. The state encoder can use different techniques for determining the weights, such as method described in relation to FIGS. 2A-2D. Additionally or alternatively, the states encoder can use different techniques, for example, a neural network trained to generate the unique weights for the power providing devices.

In some embodiments, the weights are assigned to the devices as values of the corresponding states. For example, if a state of a device has a weight 23, the value of the uniquely weighted state of the device is 23. Additionally, or alternatively, in some embodiments, a weight is a multiplication factor for the state. For example, if a weight is 32 and a state of the device is −1, the value of the uniquely weighted state of the device is −32. For example, in an embodiment described with relation to FIG. 2D, the uniquely weighted state of a device is defined by multiplying the state of the device with a factor, wherein the factor is defined using a unique multiplicity of total number of states of the device. Additionally, or alternatively, in some other embodiments, the weights is a parameter of a function of a state of the device that produces the uniquely weighted state of the device.

The control system 300 includes a state decoder 333 configured to determine the values of states of each of the devices corresponding to the received average of uniquely weighted states 395. The state decoder uses a state mapping 335 storing information indicative of a mapping between values of the average of uniquely weighted states of the devices and values of states of each of the devices. In some implementations, the mapping is predetermined and stored in the memory. For example, in one embodiment, the mapping is stored in a form of a lookup table 221 or in any other form allowing the processor to retrieve the values of states of each of the devices from the predetermined mapping. This embodiment allows to increase the speed of post-disaster topology recovery.

In alternative embodiments, the information includes data sufficient for simulate the consensus protocol with different values of the state of the devices in the power distribution network. For example, the information includes the unique weights for states of each of the devices allowing to determine the mapping, and the processor is programmed to determine the mapping in response to receiving the average of uniquely weighted states. This embodiment allows to rapidly adapting the control system 300 to the changes in topology of the power distribution network.

Figure 3B:
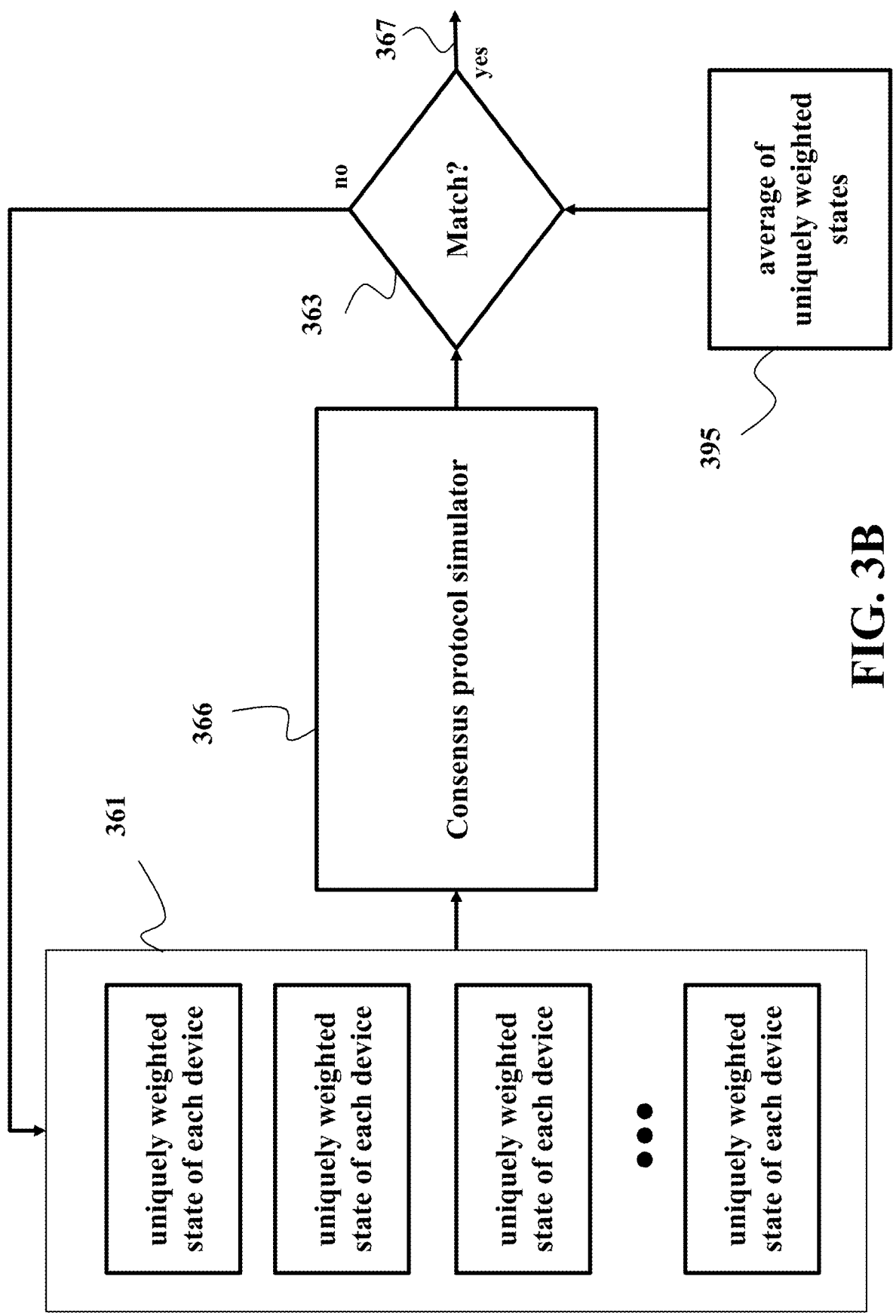
FIG. 3B is a schematic of a dynamic estimation of the states of devices in power distribution network according to some embodiments.

FIG. 3B shows a schematic of a dynamic estimation of the states of devices in power distribution network according to some embodiments. The embodiments use a simulator 366 to simulate the consensus protocol for different combinations 361 of uniquely weighted state of each device. Each simulated result is compared 363 with the value of the average of uniquely weighted states 395 determined by the devices 318. The combination 361 for which the simulation 366 results in the average of uniquely weighted states 395 is selected 367 as the state of the power distribution network.

In some implementations, the processor simulates the execution of the consensus protocol using a neural network trained to output the values of the states of the devices in response to inputting the average of uniquely weighted states into the neural network. The neural networks are a family of models inspired by biological neural networks and are used to estimate or approximate functions that can depend on a large number of inputs and are generally unknown. The neural networks are generally presented as systems of interconnected nodes or "neurons" that exchange messages between each other. Each node is associated with a function for transforming the message. This function is usually non-linear to form a non-linear part of message transformation. Each connection between the nodes is associated with a numeric weight for scaling of the messages to form a linear part of message transformation.

Figure 3C:
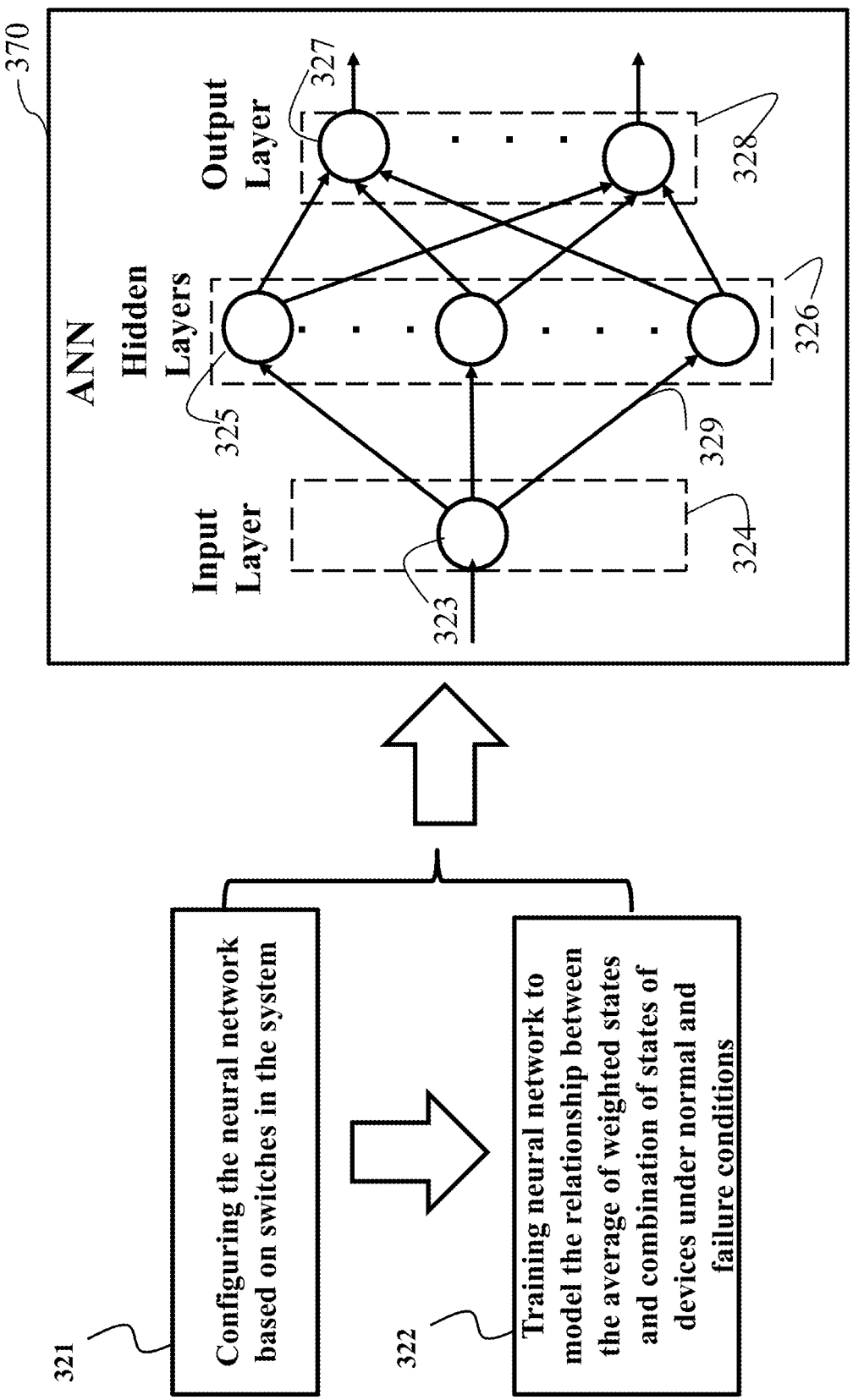
FIG. 3C is a simulator implemented as a neural network according to some embodiments.

FIG. 3C shows a simulator 366 implemented as a neural network 370 according to some embodiments. Some embodiments are based on recognition that a neural network can explicitly model the relationship between the combination of states of the devices (as outputs of neural network) and the average of uniquely weighted states (as inputs of neural network) that can be further used to identify the states for each switch when an average of uniquely weighted states is given. This is advantageous for fast identifying the topology of the distribution network particularly when agent failures or link failures occur in the communication network corresponding to the distribution network under disaster situations.

Referring to FIG. 3C, a multiple-layer feed-forward neural network 360 is used to model the relationship between the average of weighted states of switches and the combination of states of switches. The layers of the neural network are configured according to the total number of switches in the distribution network, 321. The input layer of the neural network, 324 includes only one neuron 323 to receive the average of weighted states of switches as inputs. The neural network includes one or more hidden layers 326 and each layer may have multiple neurons 325. The output layer of the neural network, 328 includes multiple neurons 327 to output the states of switches in the distribution network. The neural network 370 is first trained using a backpropagation algorithm with a set of sample data set for different combination of switch states and communication network conditions, 322. Each neutron in the output layer corresponds to a switch in the distribution network. Besides the normal condition that all nodes and links of the communication network are functioning, the abnormal conditions of communication network such as link failures and node failures are also simulated and used for training. During real-time application, the trained neural network can quickly give all switch states once an estimated average of weighted states of switches are given.

Referring back to FIG. 3A, the control system 300 includes a path estimator 337 configured to determine, based on the values of states, a new value of the state of at least on device allowing to reroute distribution of the power and command to the device to change the state to the new value. Some embodiments are based on recognition that by changing state so the devices, the power supply can be rerouted. Such a rerouting is used by some embodiments for energy flow recovery in power distribution networks.

In some implementations, the path estimator 337 uses a pre-disaster topology and the states of the devices to estimate the available routs, identify the blockage and estimate the possible alternative routes for supplying the power. The pre-disaster topology identifies the type, location and connection of the devices in the power distribution networks, and the states of the devices defines current statuses for post-disaster topology. That information are used in combination to determine the optimal restoration scheme to restore the power supply interrupted by the disaster.

Figure 3D:
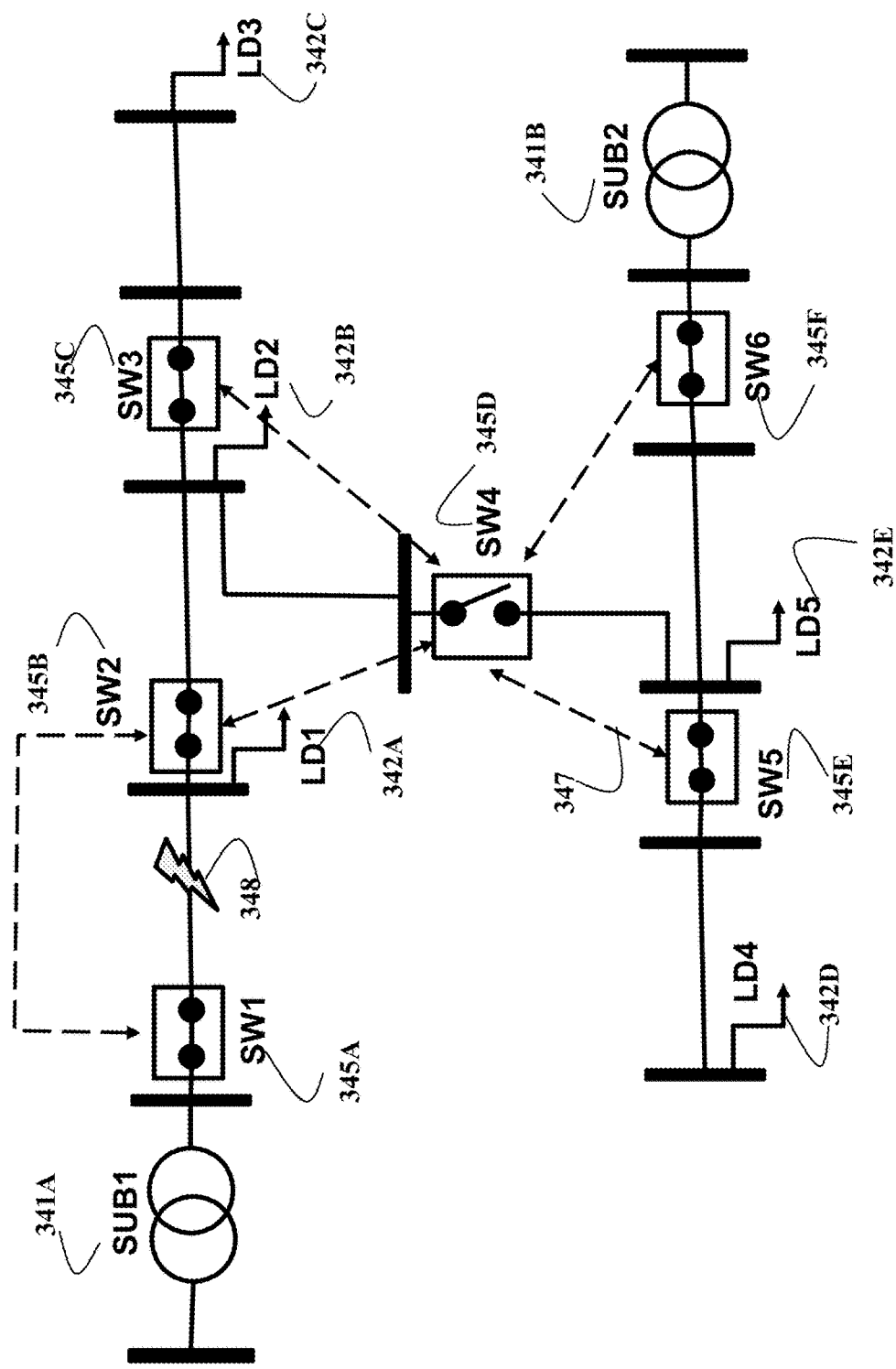
FIG. 3D is an exemplar power distribution network under disaster conditions controlled using principles of some embodiments.

FIG. 3D is an exemplar power distribution network controlled using principles of some embodiments. Each line within the system has a device for providing power, e.g., a smart switch which acts as an agent and can communicate with its neighboring agents. Each device has its type and location on the power distribution network allowing by changing the state of the device to change the passage of the power.

As shown in FIG. 3D, the distribution network has two substations, SUB1 341A and SUB2 341B to provide power supply to 5 loads, LD1 342A, LD2 342B, LD3 342C, LD4 342C, and LD5 342D. The two substations are connected each other with a normally opened tie-switch, SW4 345D. There are 5 normally closed sectioning-switches in the distribution network to control the energy flows within the network, including SW1 345A, SW2 345B, SW3 345C, SW5 345E, and SW6 345F.

Still referring to FIG. 3D, the system is under a partial blackout caused by a short circuit fault 348 resulted from a natural disaster. Natural disasters, such as hurricanes, floods, wind storms, earthquakes, and tsunamis have historically been at the root of the world's most severe power outages. Those severe weather events can completely destroy critical power infrastructure and result in outages that leave expansive geographic regions without power for days, weeks, and even months. Short circuits on the distribution lines are one of the primary causes of power outages, and occur when the insulation of the wiring used breaks down, or due to the presence of an external conducting material, such as water introduced into the circuit. The normally closed switches connected to the distribution lines with short circuits have to be opened to protect the lines from damages resulted by excessive currents caused by short circuits. When the short circuit 348 is occurred, the switches SW1 345A and SW2 345B will be opened, then all loads fed by the substation SUB1, 341A, including LD1 342A, LD2 342B and LD3 342C will loss the power supply. All other loads fed by the substation SUB2, 341B still have lights on. The distribution system can obtain the switch statuses within the blackout area by triggering an average consensus among smart switches in the area. After the topology of disaster affected area is identified, the next action for the distribution operator is restoring the power supply for the blackout area as much as possible, and as soon as possible. This action is implemented with the help of the path estimator 337.

FIG. 3D gives a pre-disaster topology showing distribution lines and the placements of the devices on the distribution lines. Each device may be identified by its ID, location, type and other attributes. The device can change its state, i.e. go to on or off state automatically, due to short circuit caused by disaster, or upon receiving a command from the distribution system.

Figure 3E:
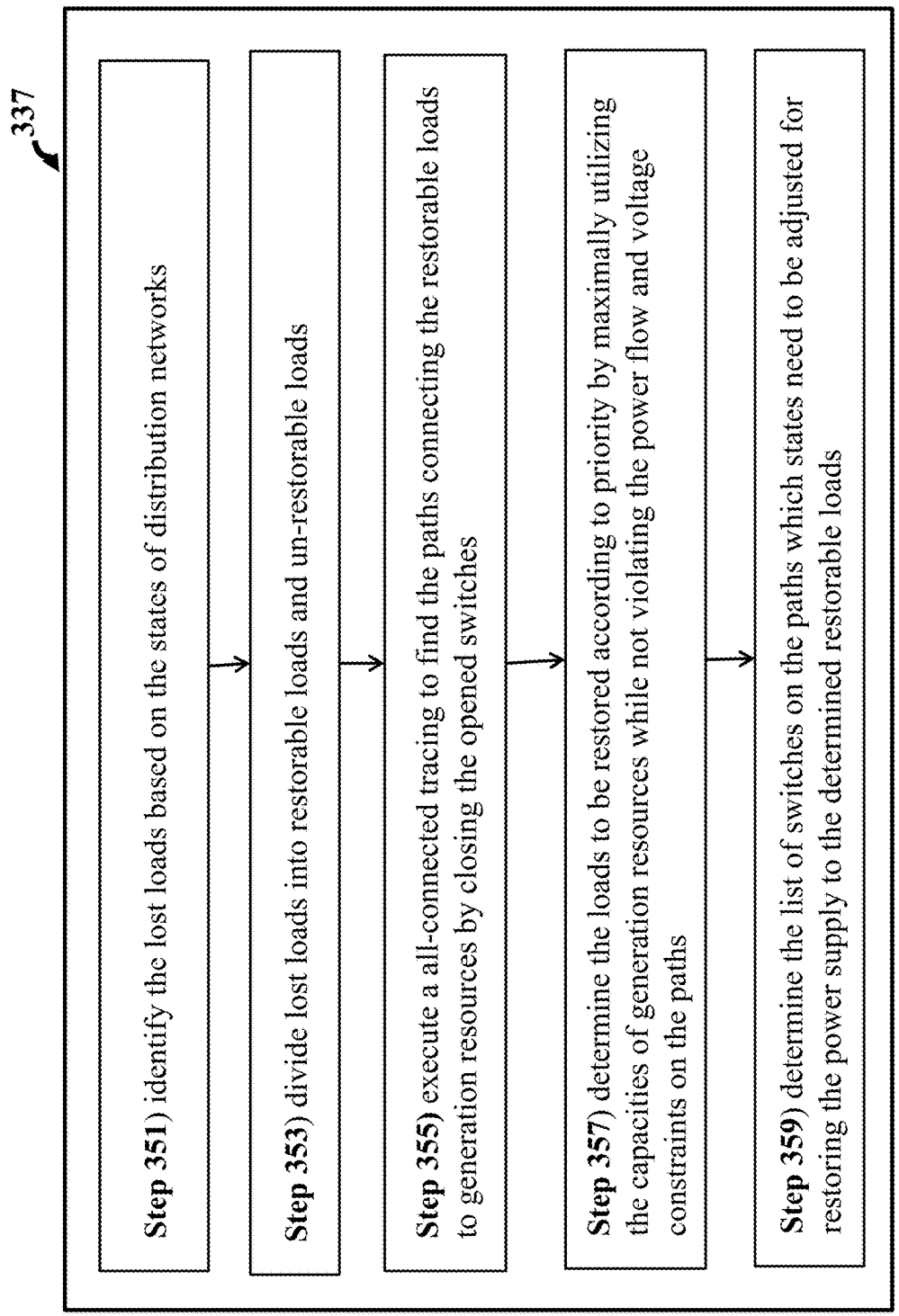
FIG. 3E is a schematic of a method used by the path estimator for estimating a new value of the state of at least on device according to some embodiments.

FIG. 3E shows a schematic of a method used by the path estimator 337 for estimating a new value of the state of at least on device according to some embodiments. The steps used by the path estimator 337 include identifying the lost loads based on the states of distribution networks (step 351), dividing lost loads into restorable loads and un-restorable loads (step 353), executing an all-connected tracing to find the paths connecting the restorable loads to generation resources by closing the opened switches(step 355), determining the loads to be restored according to priority by maximally utilizing the capacities of generation resources while not violating the power flow and voltage constraints on the paths (step 357), and determining the list of switches on the paths which states need to be adjusted for restoring the power supply to the determined restorable loads (Step 359).

Still referring to FIG. 3D, using the method described in FIG. 3E, the power services of the blackout area can be restored accordingly. After all states of switches, SW1-SW4 are determined based on the average of weighted states of switches, we can recognize that power outage is caused by switching off of switches SW1 and SW2. Based on the pre-fault topology, we can know the faulted line is between SW1 and SW2, and accordingly the loads fed by isolated lines, i.e. LD1 are an un-restorable load. In comparison, all other loads, i.e. LD2 and LD3 are restorable. The next step is to determine how to restore the restorable loads, LD2 and LD3. Through an all-connected tracing based on pre-fault topology from LD2 and LD3, we find the alternative source, SUB2 can be possible used to restore the power supply. Then we can determine whether SUB2 has sufficient remaining capacity to fully or partially restore load demands from LD2 and LD3 besides its current loads, LD4 and LD5. If no extra capacity is available for LD2 and LD3, no switch state changes are needed, and LD2 and LD3 could not be restored at current moment. If both loads can be restored, changing the state of switch SW4 from off to on is required. If only one load can be restored, but LD2 is more important than LD3, then we can restore power supply to LD2 only by switching SW4 from off to on and SW3 from on to off. After the determined new states for switchers are achieved, the desired energy flows for power supply to disaster affected area are rebuilt accordingly.

Figure 3F:
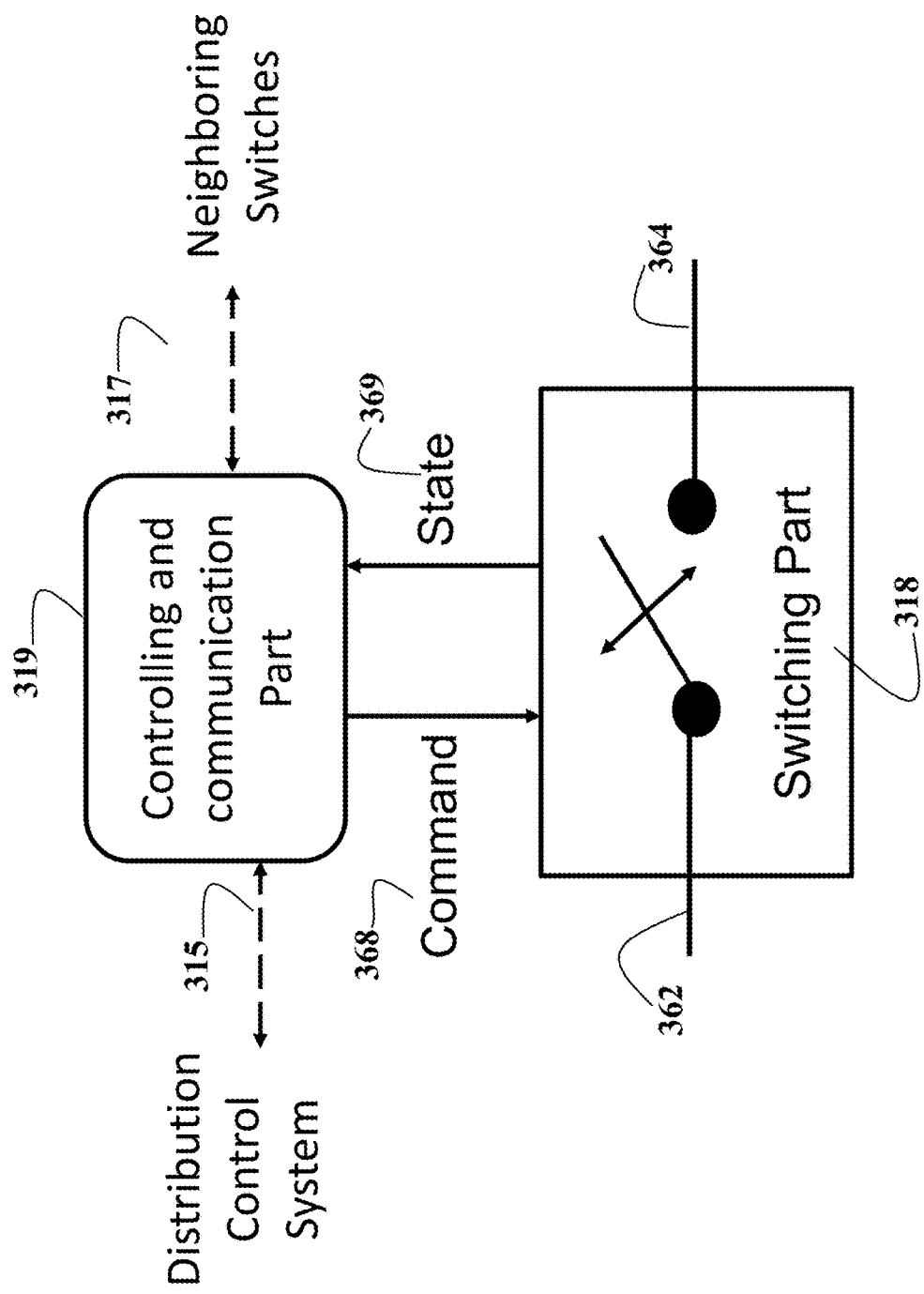
FIG. 3F is a schematic of a device agent of a device for providing power in the power distribution network of FIG. 3D controlled using principles of some embodiments.

FIG. 3F is a schematic of a device for providing power in the power distribution network of FIG. 3D controlled using principles of some embodiments. In this example, the device is a smart switch, including a switching part 318, and a controlling and communication part 319. The switching part 318 has a number of states including an on state for passing power through the device and an off state for not passing the power through the device. The power can flow through the device bi-directional, either from 362 to 364, or reversely from 364 to 362. The switching part 318 can also have states for mal-function, such as failed to open, and failed to close. The switching part can change the state of the device between on and off when a command 368 is received from the controlling and communication part 319 of the device, and can also send the states to the controlling and communication part 319. The controlling and communication part 319 can communicate the distribution control system 300 to update the device state and receive state change command, and communicate with neighboring devices upon the estimations for the average of weighted states of switches in the distribution network. The distribution operator can control this device to change the state of the device, and redirect the power flow when a disaster induced power outage is present.

Figure 3G:
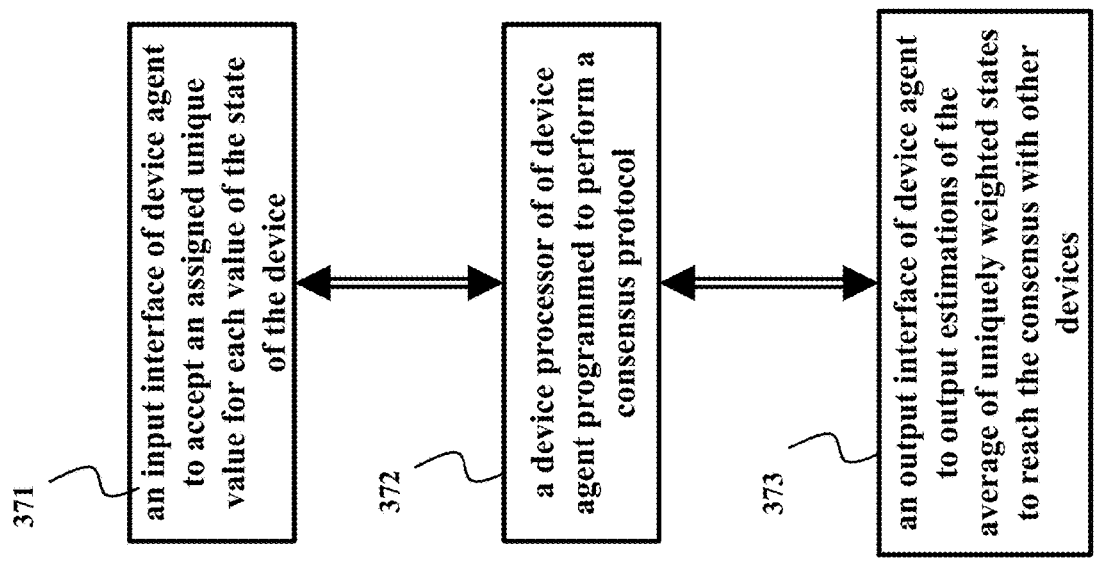
FIG. 3G is a block diagram of a device of FIG. 3F configured for performing uniquely weighted consensus protocol according to some embodiments.

FIG. 3G is a block diagram of a device of FIG. 3F configured for performing uniquely weighted consensus protocol according to some embodiments. The device includes an input interface 371 to accept an assigned unique value for each value of the state of the device. In some implementations, the device accepts values determined by the state encoder 331. Additionally, or alternatively, the device can randomly generate its weights and transmit the randomly generated weights to the control system 300.

The device also includes an output interface 373 to output estimations of the average of uniquely weighted states to reach the consensus with other devices in the set. For example, the device outputs intermediate results of the consensus protocol to the neighboring devices. Additionally, or alternatively, the device can use the output interface to communicate with the control system 300. For example, the device can transmit to the system 300 the randomly generated weights and/or the average of uniquely weighted states 395.

The device also includes a device processor 372 programmed to perform a consensus protocol. Various examples and principles of the consensus protocol are disclosed with relations to FIGS. 2A-2D.

FIG. 3H shows a block diagram of a consensus protocol performed by a device for providing power according to one embodiment. The device maintains a local estimate of the average of weighted states of all devices. The local estimate is initialized with the value determined through a state coder based on the current state of the device as shown in FIG. 2A-FIG. 2D. When the device receives local estimations from neighboring devices 376, it updates the estimate by performing an average weighting of the estimates received 377 using equation (2), and then transmits its estimate to all its neighbors 378.

Distributed Average Consensus Protocol

A power distribution network can have thousands of nodes and hence it might not be efficient to run consensus protocol for a large-scale network. A system partitioning is used when using aforementioned topology detection approach to a practical system for further fasten computation and avoid possible data range violation.

Figure 4:
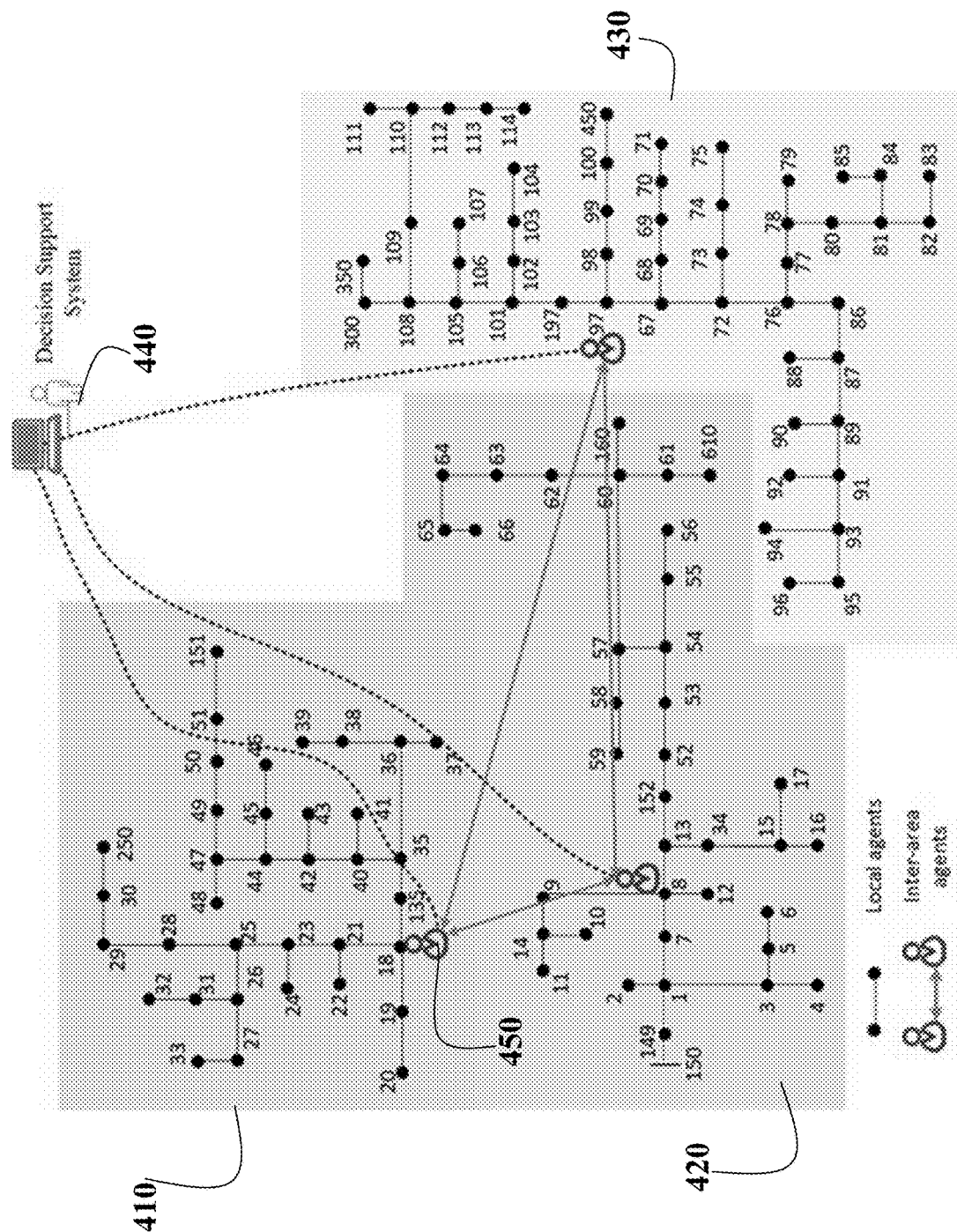
FIG. 4 is a schematic illustrating a framework for distributed consensus algorithm, according to embodiments of the present disclosure.

FIG. 4 shows the schematic for a framework of distributed consensus protocol used to an exemplar 123-node power distribution network according to some embodiments.

Assumed it has experienced a severe damage after a natural disaster. Each line within the system has a smart switch which acts as an agent and can communicate with its neighboring agent. Using consensus protocol, after several iterations, all agents come to an agreement, and an overall estimate of the power distribution system topology can be made. In some embodiments, the 123-node power distribution network is partitioned into multiple sub-graphs, each one has an inter-area agent, and is solved by using a distributed consensus protocol concurrently.

As shown in FIG. 4, the power distribution network having 123 nodes has been divided into three sub-graphs, 410, 420 and 430 and each sub-graph has an inter-area agent, 450, such as the control system 300. The agents 450 are connected to centralized decision support system 440. For example, part of the functionality of the system 300, such as state encoder/decoder functionality can be implemented at the inter-area agent, 450. Part of the functionality of the system 300, such as power paths determination can be implemented either by local agents 450, centralized system 440 or combinations thereof.

A communication graph can be divided into sub-graphs with each graph (area) having one inter-area agent. It is assumed that each inter-area agent 450 has a relatively strong communication capability with nodes of the area. The number of inter-area agents or the number of sub-graphs can be determined based on the size of network, infrastructure cost and the required overall convergence rate. Suppose, a large distribution network with n number of agents is divided into several areas A=$\alpha_1, \alpha_2, \alpha_3, \ldots, \alpha_N$. At each area of the distribution network, the consensus update can be concurrently solved for each of them and local consensus agreement can be achieved. If number of areas is large then several areas are again grouped such that reasonable time for convergence is achieved. Basically, the problem forms layers or stages of sub-graphs where local consensus protocol is solved at each stage. Following equation (3), we can write (5) for each area on a particular stage:

$$x_{L_1}^{\alpha_i}(k+1)=W_{L_1}^{\alpha_i}x_{L_1}^{\alpha_i}(k),$$

$$x_{L_2}^{\beta_i}(k+1)=W_{L_2}^{\beta_i}x_{L_2}^{\beta_i}(k), \quad (5)$$

$$\ldots$$

$$x_{L_N}^{\gamma_i}(k+1)=W_{L_n}^{\gamma_i}x_{L_N}^{\gamma_i}(k),$$

The inter-area agents can run average consensus among themselves. If number of inter-area agents is large, i.e., large number of sub-graphs, they can again be divided into several groups to get rid of computational burden. Thus, different layers of consensus protocol can be formulated for better convergence. They reach at a consensus and converge upon the damaged system model for the entire feeder and communicate it to the corresponding decision-support systems 440.

The overall convergence time for global consensus is then equal to sum of maximum time taken by each area to reach consensus for different layers of sub-graph L which can be expressed as:

$$\tau_{total} = \underset{L_1}{\text{Max}}(\tau_{\alpha_1}, \tau_{\alpha_2}, \tau_{\alpha_3}, \ldots, \tau_{\alpha_N}) + \quad (6)$$

$$\underset{L_2}{\text{Max}}(\tau_{\beta_1}, \tau_{\beta_2}, \tau_{\beta_3}, \ldots, \tau_{\beta_N}) + \ldots + \underset{L_N}{\text{Max}}(\tau_{\gamma_1}, \tau_{\gamma_2}, \tau_{\gamma_3}, \ldots, \tau_{\gamma_N})$$

Robust Communication Network for Power Distribution Network

Figure 5A:
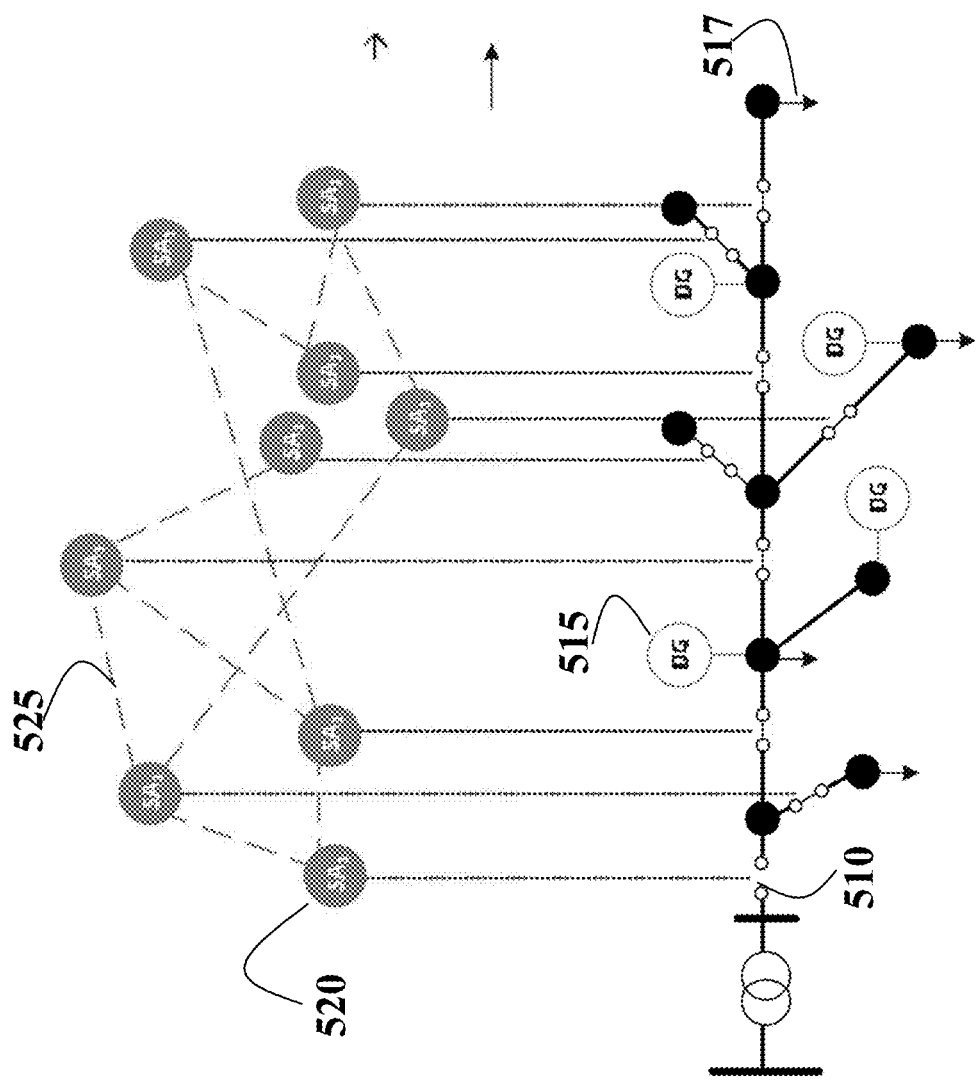
FIG. 5A is a schematic illustrating a cyber-physical system for power distribution network, according to embodiments of the present disclosure.

FIG. 5A shows a schematic for a cyber-physical system of power distribution network according to some embodiments. The power grid physical layer $G_{ph}$ depends on its communication network or a cyber layer $G_{cm}$ such that any device in $G_{ph}$ (e.g., a generator 515, load 517, or a switch 510) is operable only when its associated control point can receive a signal from some control center in $G_{cm}$. The cyber layer with communication among the smart switches is exploited in this work for obtaining the damaged model of a faulted power distribution network.

The communication 525 among agents/devices 520 is advantageous for convergence of average consensus protocol. Moreover, the local agents have constraints of communication capability limited by infrastructure cost, range of communication and energy source to support its performance. The connectivity of the communication graph determines the convergence of consensus protocol. It is desired to have a well-connected graph where each agent has communication with another agent. However, this is impractical for a power distribution network at this point of time where still it lacks the attention from utility. In such circumstance, the present disclosure discloses a method for obtaining the optimal communication topology of a sub-graph $G_{cm}(V, E_{cm})$ which helps to increase the convergence rate, and robustness for disaster condition.

For any possible new link ij between node i and node j, a ranking index $RI_{ij}$ is used to define its importance as:

$$RI_{ij} = \eta_i \deg_i + \eta_j \deg_j + \eta_{N_i} \Sigma_{k \in N_i} \deg_k + \eta_{N_j} \Sigma_{k \in N_j} \deg_k + \eta_c n(C) \quad (7)$$

Where n(C) is the size of loop formed in the network after the new link is established. The parameters, $\eta_i$, $\eta_j$, $\eta_{N_i}$, $\eta_{N_j}$, and $\eta_c$ are the contribution factors of node degrees, immediate neighbor degrees, and formed loop sizes to the overall importance index.

Figure 5B:
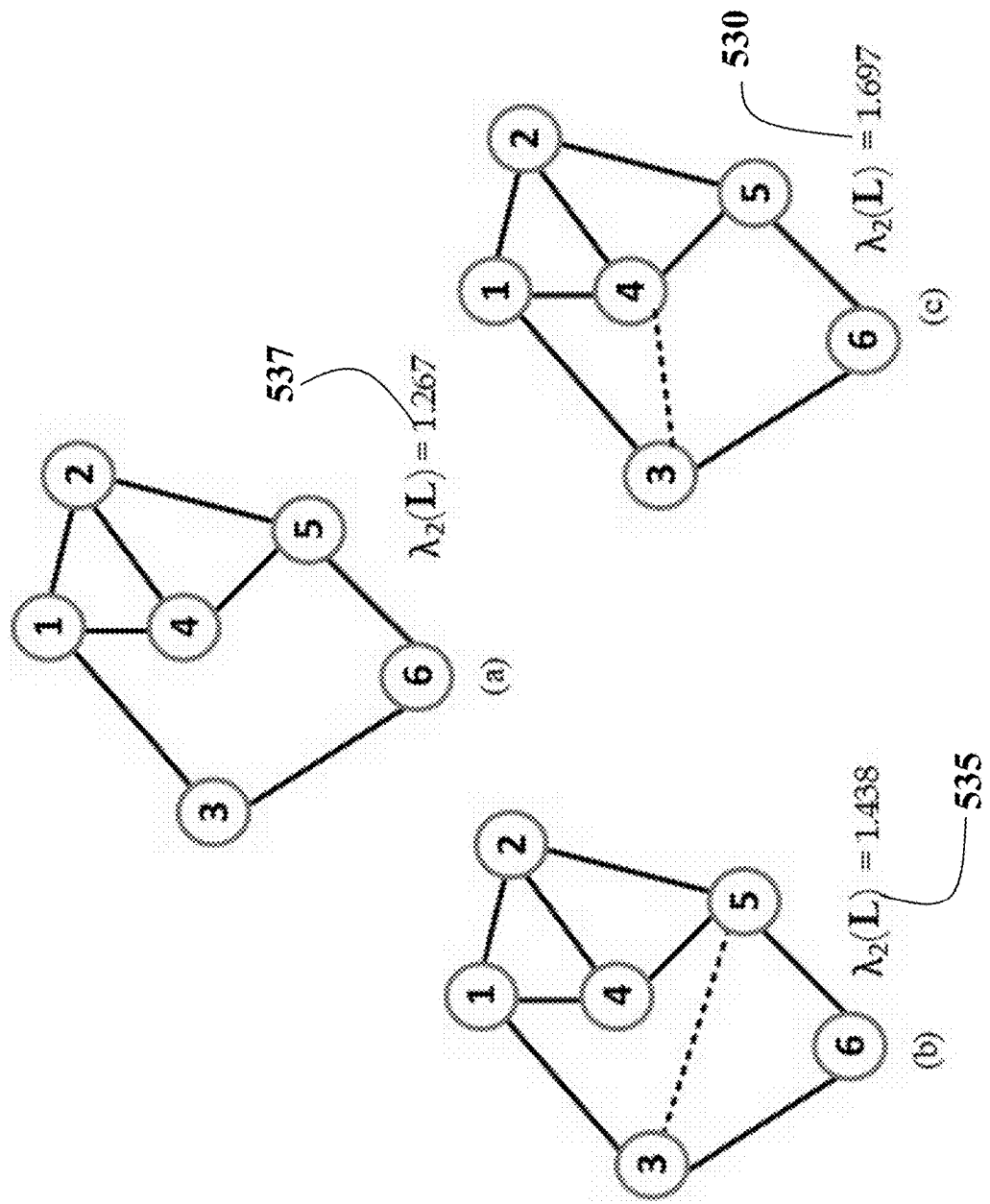
FIG. 5B is a schematic illustrating the effect of adding an edge on eigen values of graph Laplacian, according to embodiments of the present disclosure.

FIG. 5B shows a schematic demonstrating the effect of adding an edge on eigen values of graph Laplacian used by some embodiments. Different second smallest eigen values, 530, 535 and 537 can be obtained when a new link is added between different pairs of nodes. Adding edge 3-4 is more effective than adding edge 3-5 in terms of graph connectivity.

Figure 5C:
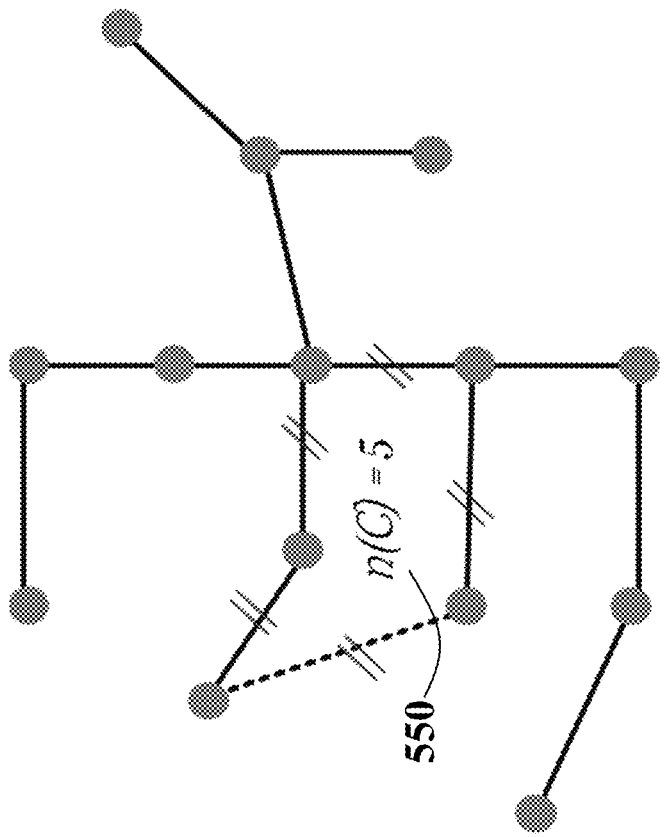
FIG. 5C is a schematic illustrating loop formation on a graph after addition of a new link and its robustness to link failures, according to embodiments of the present disclosure.
Figure 5C:
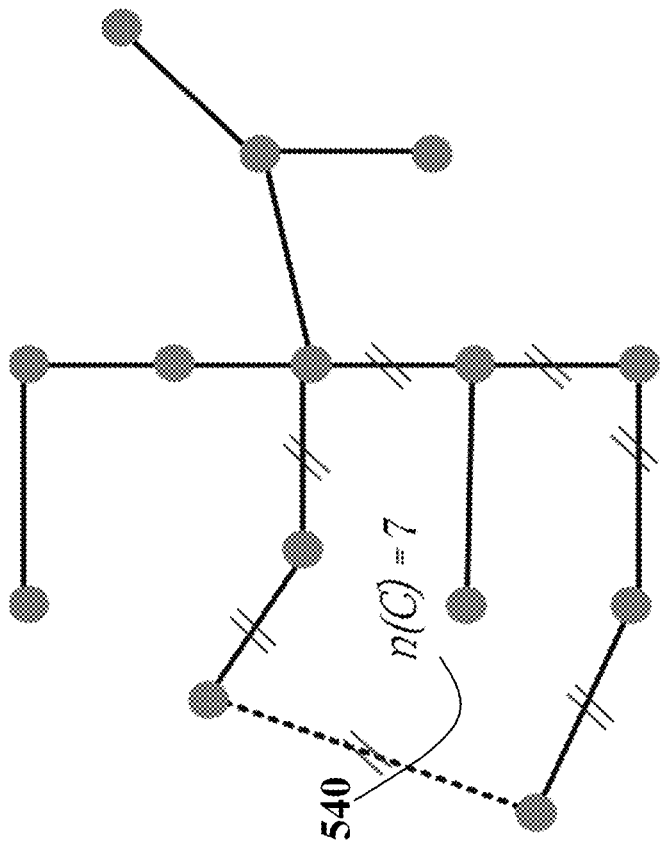

FIG. 5C shows a schematic demonstrating the loop formation on a graph after addition of a new link and its robustness to link failures used by some embodiments. For a case of single link failure, left graph 540 remains connected for 7 different links, whereas right one 550 remains connected for 5 different failures only.

Figure 6:
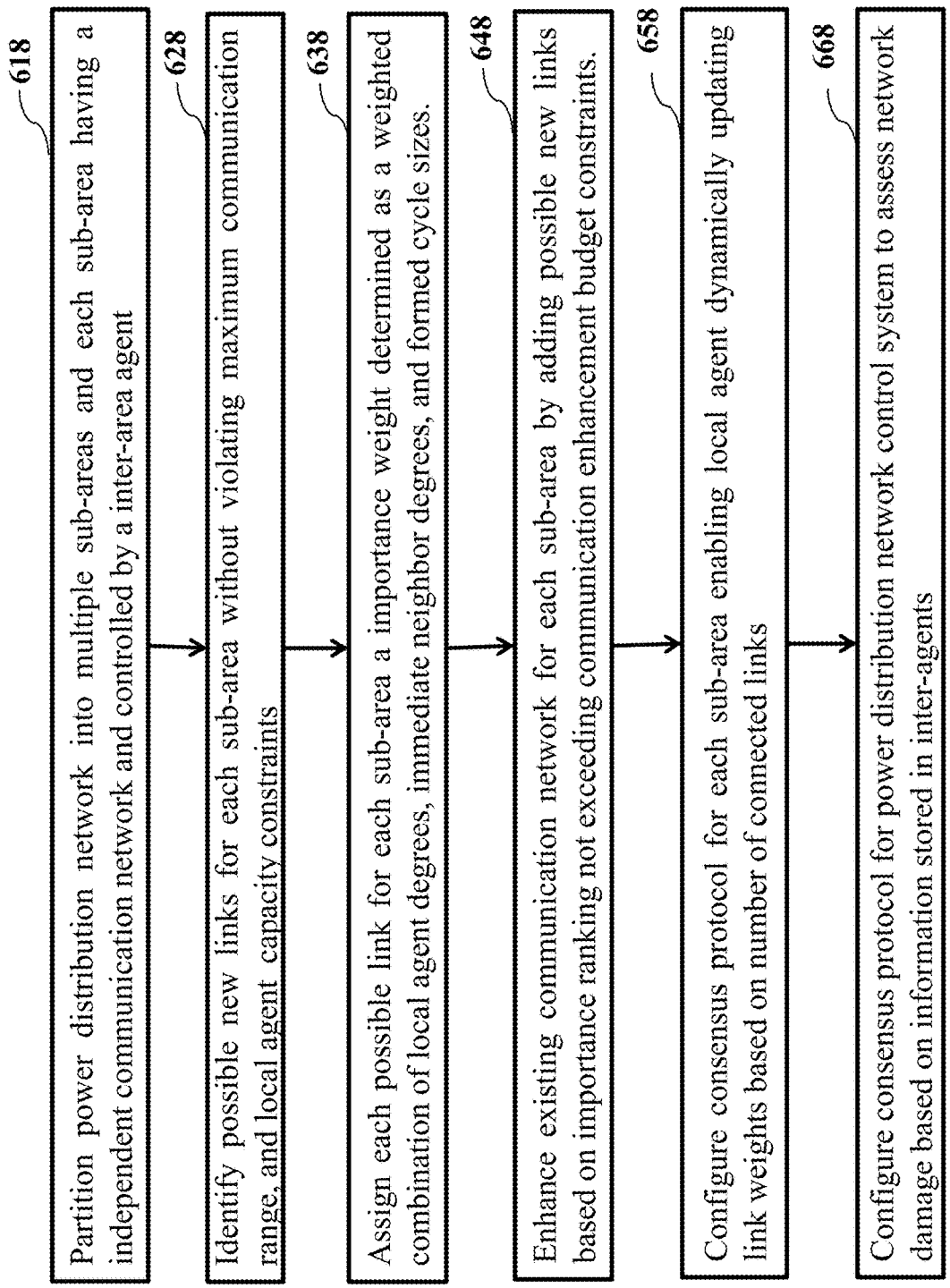
FIG. 6 is a block diagram illustrating some method steps for configuring robust communication networks for a power distribution network, according to embodiments of the present disclosure.

FIG. 6 is a block diagram illustrating some method steps for building robust communication network for a power distribution network, according to some embodiments. Referring to FIG. 6, step 618 includes the step to partition power distribution network into multiple sub-areas and each sub-area having an independent communication network and controlled by an inter-area agent. Step 628 identifies possible new links for each sub-area without violating maximum communication range, and capacity constraints. Step 638 assigns each possible link in each sub-area a importance weight determined as a weighted combination of local agent connectivity degrees, immediate neighbor connectivity degrees, and the sizes of cycle formed if added the link.

Step 648 enhances existing communication network for each sub-area by selectively adding possible new links based on importance ranking within communication enhancement budget constraints. Step 658 configures consensus protocol for each sub-area enabling local agent for each sub-area dynamically updating link weights with the changes of connected links caused by random link failures. Step 668 configures consensus protocol for the control system of power distribution network to assess network damage based on information acquired from the inter-agents.

The optimal design for a communication network of the distribution network according to one embodiment is summarized in algorithm 1.

---

Algorithm 1: design of communication topology for robust and efficient consensus protocol
1. Given $G_p(V, E_{ph})$, $d_{range}^{i,j}$ and $C_{ij}^\$$.
2. Initialize $E_{cm} = E_{ph}$.
3. Form a full connected graph $G_{cn}(V, E_{cn})$. Where, $E_{cn} = \{V \times V\}$.
4. Find a potential graph $G_{pos}(V, E_{pos})$. Where, $E_{pos} = \{V \times V\} - E_{ph}$.
5. For each edge in $E_{pos}$ do
6.     if $d(ij) \leq d_{range}^{i,j}$, then
7.         $E_{pos} \leftarrow E_{pos} - (ij)$
8.     if $(i,j) \in V_n$, then
9.         $E_{pos} \leftarrow E_{pos} - (ij)$
10. For each edge in $E_{pos}$ do
11.     Compute importance index, $RI_k$
12. Sorting all possible link by importance index at descending order.
13. Initialize $A_{cost} = 0$
14. For k ← 1 to $E_{pos}$ do
15.     $E_{cm} \leftarrow E_{cm} + E_{pos}(ind(k))$
16.     $A_{cost} \leftarrow A_{cost} + C_{ij}^\$$
17.     if $A_{cost} \geq$ Budget, then
18.         break;
19. Output $G_{cm}(V, E_{cm})$

---

The communication among agent is constrained by the range, i.e., geographical distance, and available infrastructures for enhancing the agent performance. In step 1, supposed $d_{range}^{i,j}$ be the maximum range a local agent i can reach to another local agent j, and $C_{ij}^\$$ be the infrastructure requirement for establishing new links by upgrading the agent so that it can handle additional communication burden. As the agents are located on the node or edges (switches) in a distribution network, it is desired to have a base topology as a radial network similar to the physical network (step 2).

The fully connected graph of the agents is represented by $G_{cn}(V, \{V \times V\})$, where each agent can communicate with another and possible edges (links) $E_{pos}$ are identified for adding to the communication network (steps 3 and 4).

For each possible link, the range of communication and agent capability is checked. If a communication cannot be established between any edge i, j or agents i, j belong to a set which are not available for establishing of further links ($V_n$), then it is removed from the set possible links (steps 5-9).

For the updated set of links, a ranking function is defined based on degree of agent, degree of their immediate neighbors and the size of cycle formed after link is established (steps 10 and 11). As shown in FIG. 5B, it is known that the second eigen value is dependent on the degree of node and also the connectivity of neighbors. Similarly, the robustness of the graph is realized based on size of a loop formed in the network after a new link is established, n(C) and is graphically illustrated based on FIG. 5C. It can be observed that a large size loop is more robust for a link failure than small size loop. For instance, consider a case of single link failure in the given graph. The bigger loop is robust to failure of one of the 7 links in the network while smaller loop is robust to failure of one of the 5 links only. By robustness, we mean the graph still remains connected after a failure. The importance of communication link defined by $RI_k$ sorted and new links with higher importance are established in the communication graph until the available infrastructures are exhausted (steps 12-18).

Figure 7A:
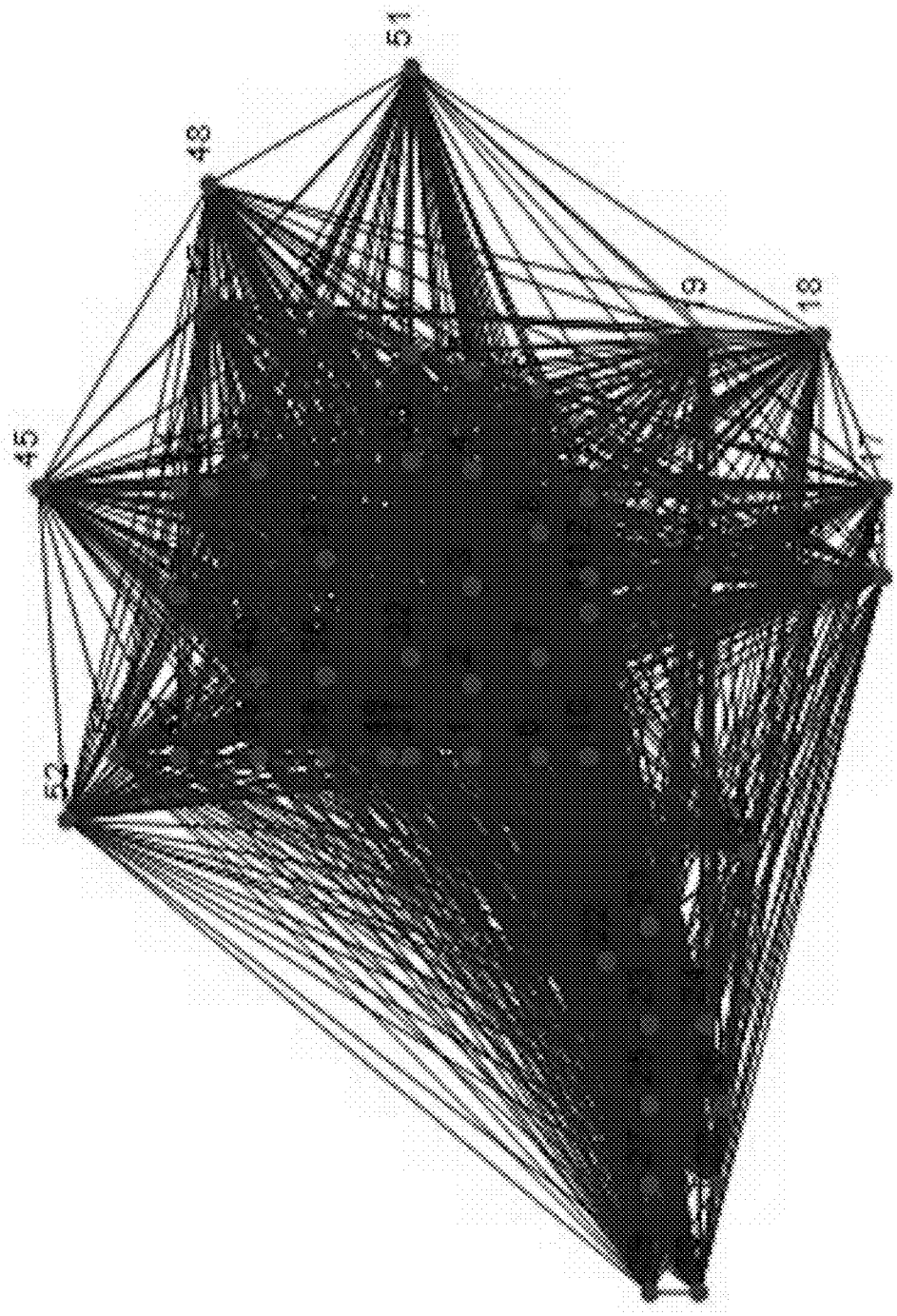
FIG. 7A is a schematic illustrating a communication topology for a fully connected sub-graph, according to embodiments of the present disclosure.
Figure 7B:
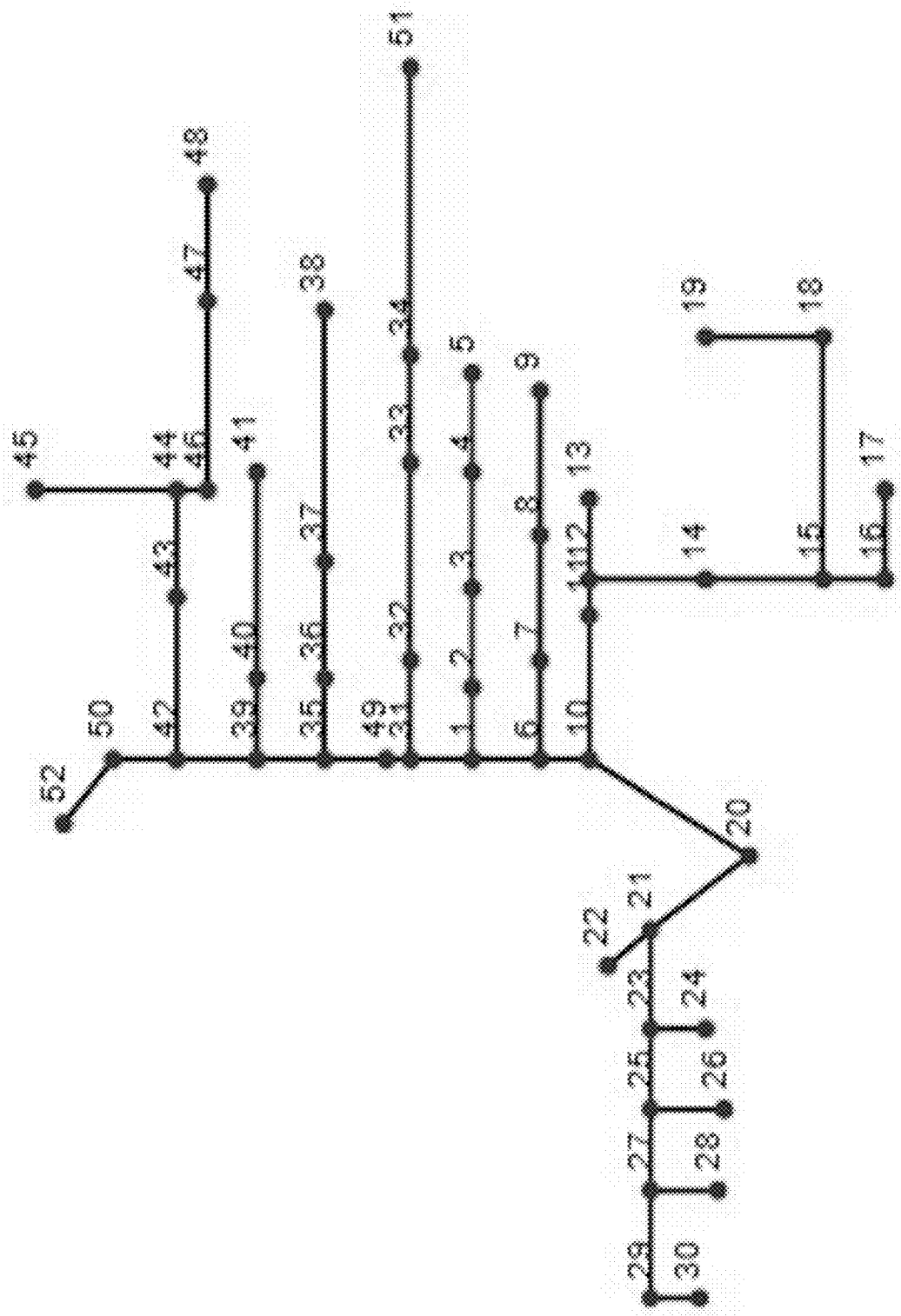
FIG. 7B is a schematic illustrating a communication topology for a base radial configuration sub-graph, according to embodiments of the present disclosure.
Figure 7C:
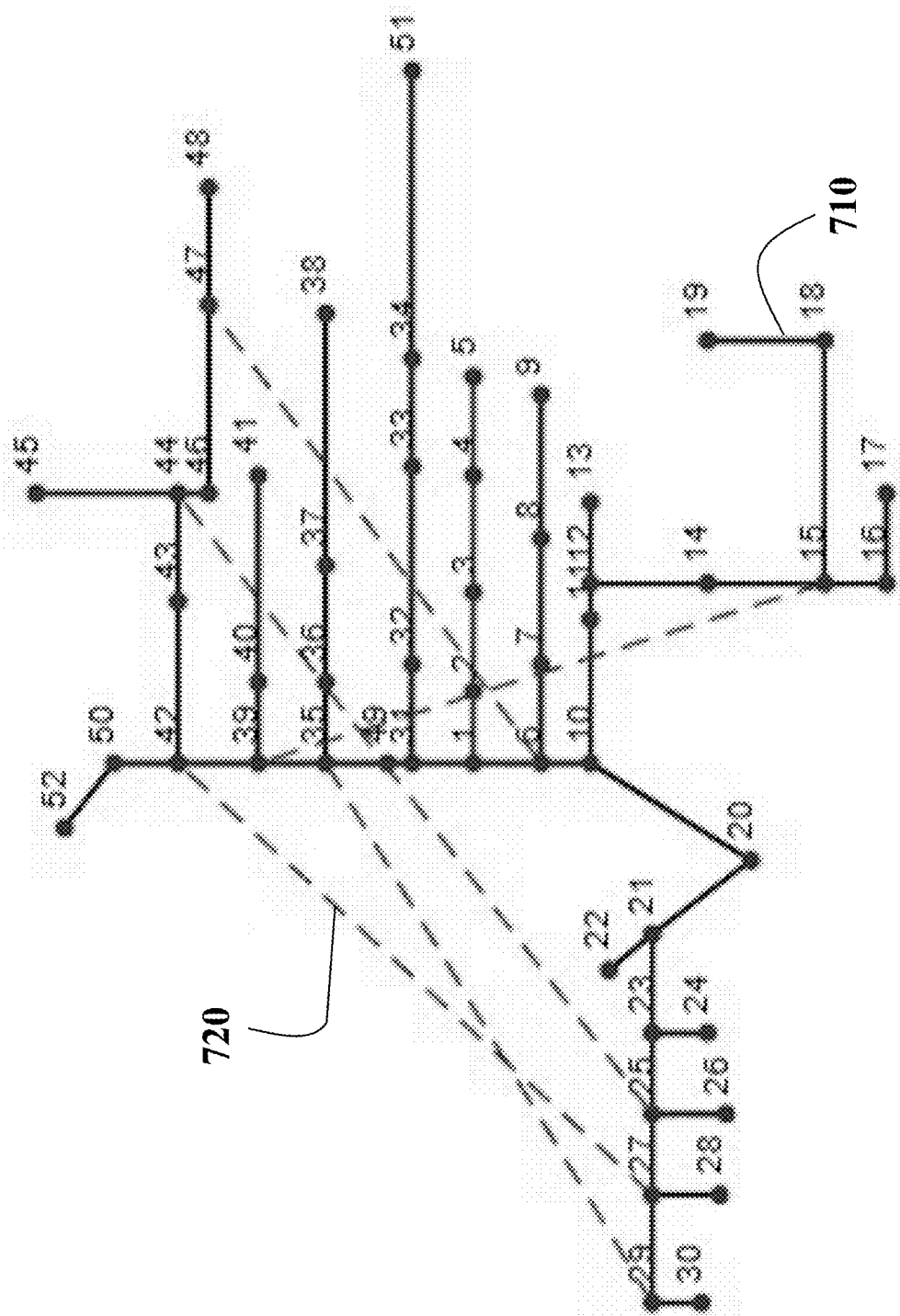
FIG. 7C is a schematic illustrating a communication topology for a sub-graph after new added links are optimized, according to embodiments of the present disclosure.

Taken the 123-node network of FIG. 4 as example, the communication links are initially established based on the algorithm 1 for each sub-graph. FIGS. 7A, 7B, and 7C gives an example for design of a communication topology for a sub-graph $G_{cm}(V, E_{cm})$, including (a) fully connected sub-graph, (b) base radial topology of the communication graph, and (c) new added links to obtain an optimal graph for consensus protocol. First, a fully connected graph is formed based on agent geographical location, FIG. 7A. Next, a base case topology is identified which is the same as the physical topology of the network, FIG. 7B. Finally, algorithm 1 is implemented and several links are then established to get final communication graph, FIG. 7C.

The local agents in a sub-graph now run their own consensus protocol. Note that, a similar process is repeated for each area. After the consensus protocol converges in each area, the inter-area agent then communicates among themselves for obtaining the overall damage model of the distribution feeder.

Table I summarizes the performance of consensus protocol for each sub-graph using the sequential approach. It is observed that the number of iterations and simulation time reduces drastically by splitting the large network into several sub-graphs. This approach thus helps to achieve the damage model of power distribution system quickly after a disaster event.

TABLE I distributed consensus protocol for each area

| Sub-graph | Area 1 | Area 2 | Area 3 |
|---|---|---|---|
| Number of agents | 35 | 38 | 52 |
| Simulation time (s) | 1.9 | 2.65 | 5.86 |
| Number of iterations | 582 | 747 | 971 |

Dynamic Weight Adjusting for Communication Network with Random Link Failures Sometimes during disaster conditions, challenges may occur in the convergence of consensus protocol for doing a damage assessment because of link failures due to the agent not succeeding in establishing the communication, or node failures (e.g., due to draining of batteries supporting an agent). Thus, in such a case the communication graph will be time-varying, and the weight matrix for time instant k can be denoted by W(k).

To capture dynamically changing topologies it is assumed that the set of agents is fixed, V=1,2, . . . , n but the set of links among them might change at various time steps during the consensus update.

For such a highly volatile system, an approach based on dynamic topology change is used to ensure the fault-tolerant information dissemination among the distributed agents. In order to handle the changing interconnections in a disaster-impacted communication graph, the following assumptions are made. Firstly, a transmitting node knows the number of neighboring nodes receiving its information at any instant, and this requirement is not difficult in any undirected graph (i.e. bi-way communication network). Secondly, to keep things simple, it is assumed that there exist no delays in any communication links. Thirdly, communication links can be established or terminated throughout the iterative algorithm by any nodes.

Note that specific weights in W(k) are set to zero which corresponds to pair of nodes that are not connected at a particular time step k. Mathematically, $$w_{ij}[k]=0, \forall (i,j) \in E^f, i \neq j, \quad (8)$$

where, $E^f$ is the set of failed links and $w_{ij}$ is one of the elements of matrix W representing a weight. Thus, equation (3) can be rewritten as:

$$x(k+1)=W(k)x(k). \quad (9)$$

This means, at any instant, a node i has a set of neighboring nodes $N_i[k]$ and degree $deg_i[k]$. Specifically, the weight on an edge (link) is assigned based on the larger degree of its two incident nodes in real time:

$$w_{ij}[k] = \frac{1}{\max(deg_i[k], deg_j[k])}, \forall (i, j) \in E_{cm}. \quad (10)$$

Figure 8:
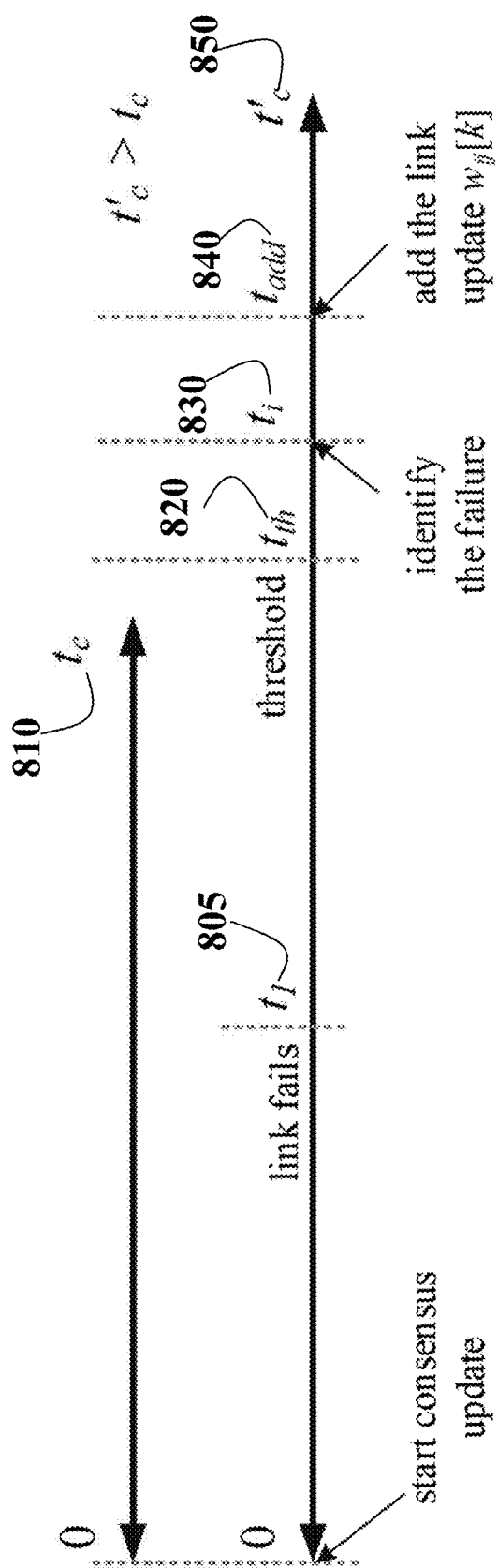
FIG. 8 is a schematic illustrating general time-line for dynamic topology update in consensus algorithm, according to embodiments of the present disclosure.

FIG. 8 shows the convergence timeline for a post-disaster consensus protocol according to some embodiments. During normal communication among agents, the consensus protocol converges in time $t_c$, 810. In this stage, either sequential approach, or simultaneous approach can be used. Suppose, a communication link fails at time $t_1$ 805. Let us assume that the failure makes the communication graph disconnected. In this scenario, the algorithm fails to converge within time $t_c$ 810. A threshold time ($t_{th} > t_c$), 820 is defined to ensure the graph became disconnected because of link failure and consensus protocol ceases to converge. This is beneficial because it is likely that the consensus protocol can converge for $t_c \leq t \leq t_{th}$ because not all failure makes a graph disconnected but will result in reduced Laplacian i.e., decrease in $\lambda_2(L)$.

A failure is identified by observing the real-time error of the consensus update at time $t_f$, 830. The sequential approach is recommended to be used in this state. Once it is identified, new links are established to ensure the graph is connected. To establish a new link, it is required to remove some redundant links because an agent has a limited communication capability and cannot handle any additional new links. This is in accordance with the fact that agent capability and resources are fully utilized for designing the communication graph in algorithm 1. With the removal or addition of links 840 in the graph, the weight $w_{ij}[k]$ is also updated. Now the algorithm finally converges at time $t'_c$ 850. Either sequential approach, or simultaneous approach can be used for this stage. This is summarized in algorithm 2.

Algorithm 2: Dynamic Topology Change for Link and Agent Failures

1. Given: $G_{cm}(V, E_{cm})$ from algorithm 1, $t_{th}$
2. Run distributed consensus protocol, equation (5) at time k
3. If $t > t_{th}$, then
4. identify failure links;
5. identify node/s to establish a new link;
6. remove corresponding redundant links from algorithm 1;
7. add new link to identified node in step 5;
8. update $w_{ij}[k]$;
9. k←k+1
10. Output consensus update To demonstrate the robustness of the proposed approach for link failures, a random failure is introduced into the system. Area 3 of the 123-node feeder as shown FIG. 7C is taken as an exemplar area having the failure.

Figure 9:
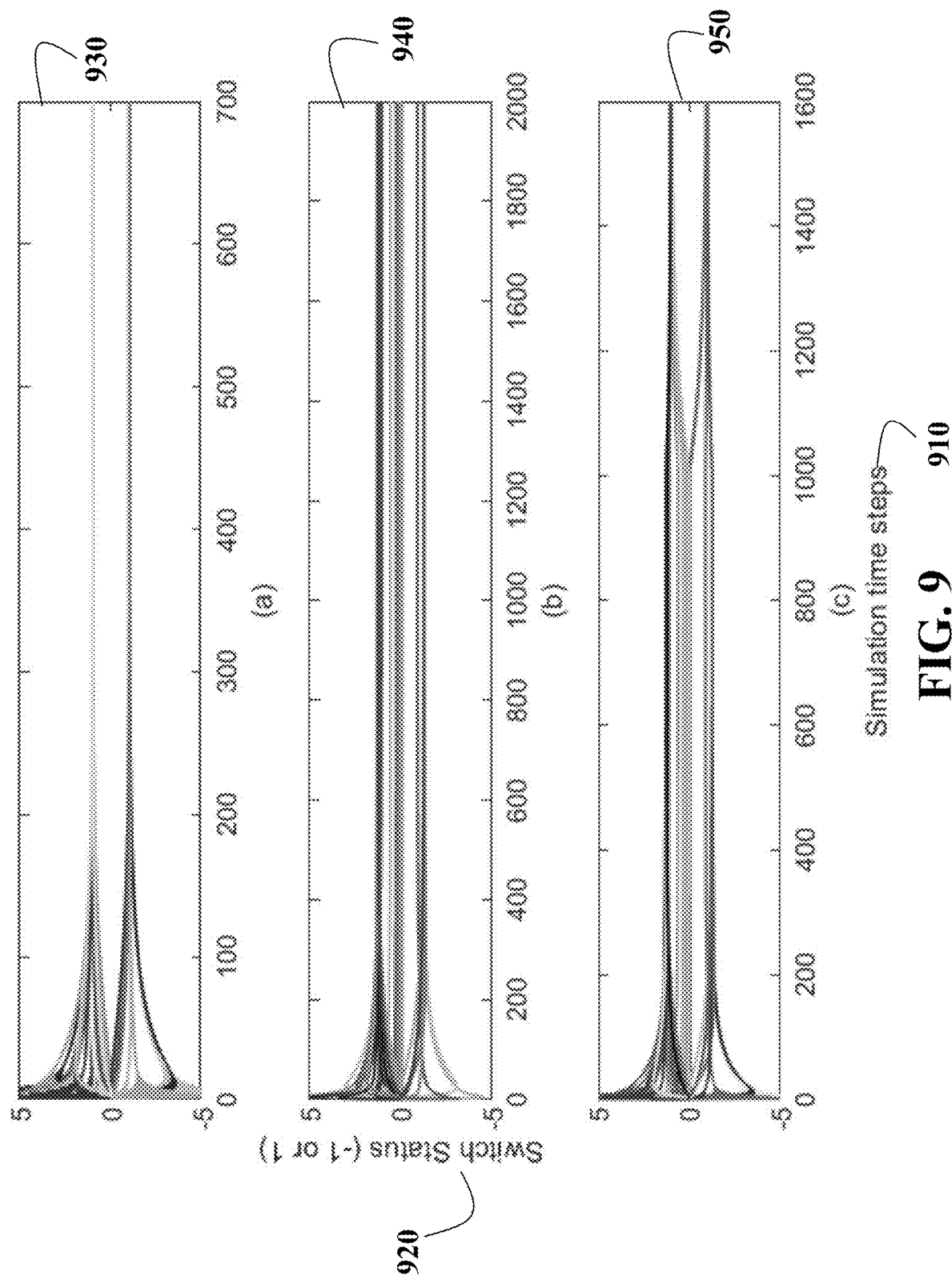
FIG. 9 is a schematic illustrating convergence of average consensus algorithm for random link failure, according to embodiments of the present disclosure.

FIG. 9 illustrates the convergence results for applying distributed consensus protocol to the 123-node test feeder, and the sequential approach is used. Where the horizontal and vertical axes represent the simulation time steps and corresponding switch statuses, 910 and 920 respectively.

The top portion of FIG. 9 shows in absence of failure, the consensus protocol converges and provides corresponding switch status. At particular time step k, a random link failure is introduced. With this failure, as shown in the middle portion of FIG. 9, the algorithm doesn't converge for several rounds of iterations. At this point, a failure link has to be identified and a new link has to be established.

Figure 10:
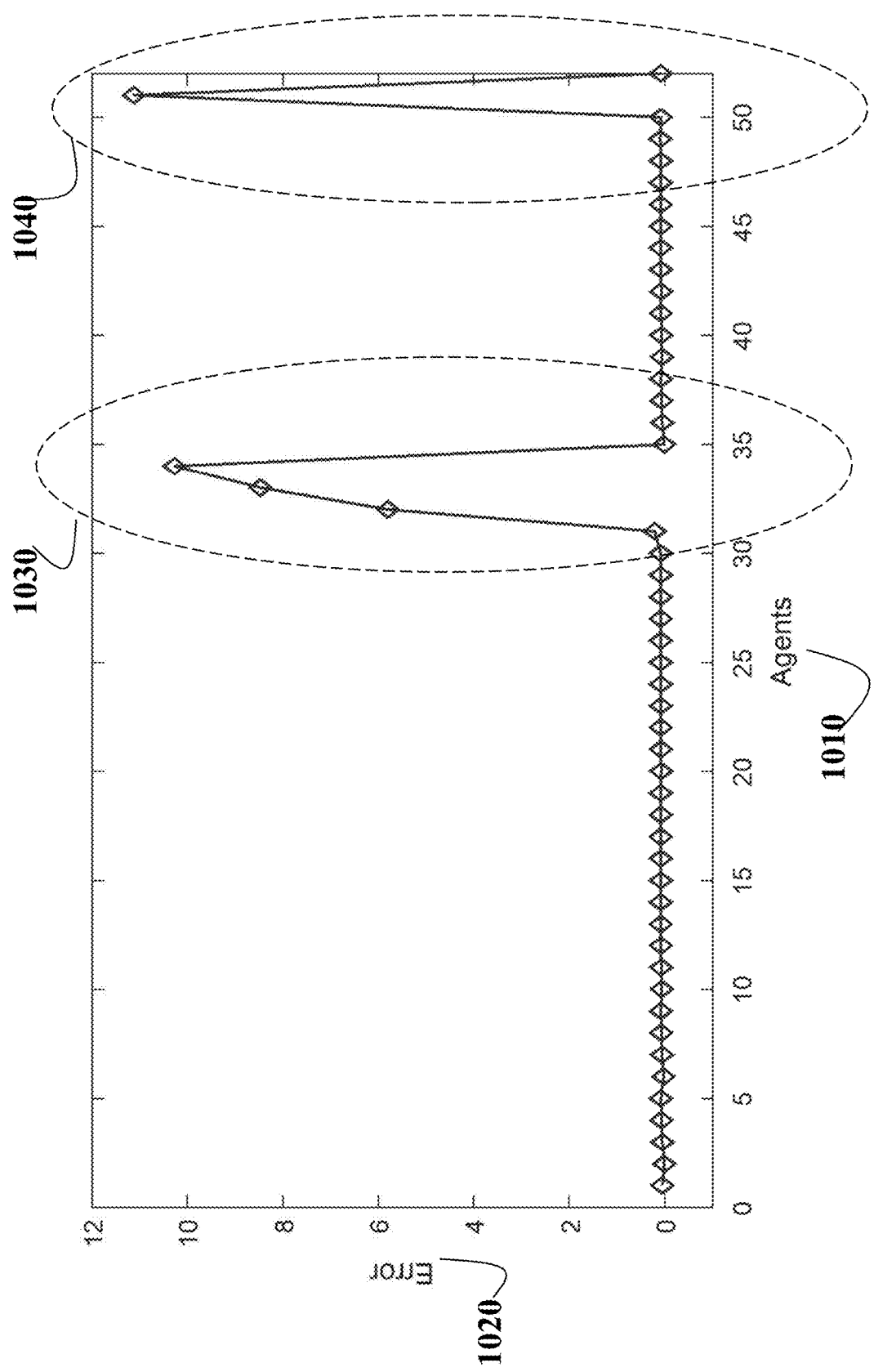
FIG. 10 is a schematic illustrating error in the state of each agent at time the link failure is identified, according to embodiments of the present disclosure.

The failure links can be identified through analysis of real time errors for agent states through sequential approach. The real-time error of the agent state is plotted in FIG. 10, where the horizontal and vertical axes represent the agents and errors, 1010 and 1020 respectively. It is observed that the errors of few agents are much higher than the rest of the agents.

Based on this, a disconnected portion of the graph is identified (32-33-34-51), 1030 and 1040. Now, a new link is established after a few time steps between nodes 32 and 47. To do this, link 46-47 is taken down because agent 47 cannot handle new additional link as it is not coped with enough capability for additional communication burden. The weight matrix is then updated dynamically following equation (10). Finally, the convergence of consensus update is guaranteed as seen in the bottom portion of FIG. 9.

It is noted that it usually takes time for establishing a new link to reconnect the isolated nodes with the connected communication network. Before the new link is established, except the isolated nodes, the states for all other devices can still be detected by running an average consensus without the isolated nodes, and the switch states are decoded based on the new set of available devices.

The relationship between the average of uniquely weighted states corresponding list of devices and the combination of states of those devices can be pre-determined by given isolated node information, or determined in real-time by simulating a execution of a consensus protocol by the set of devices with different values of the uniquely weighted state of each device to determine the uniquely weighted states of the devices that result in the received average of uniquely weighted states, and determines the mapping from the determined uniquely weighted states of the devices.

Features

Aspects of embodiments of present disclosure provide a control system is configured for controlling a power distribution network including a set of devices for providing power, the devices include one or combination of a breaker, a recloser, and a sectionizing switch, and a tie-switch, the control system comprising a transmitter configured to command the devices to reach a consensus on an average of uniquely weighted states of the devices based on iterative exchange of a uniquely weighted state of each device with its neighboring devices; a receiver configured to receive, in response to transmitting the command, the average of uniquely weighted states of the devices; a memory configured to store information indicative of a mapping between values of the average of uniquely weighted states of the devices and values of states of each of the devices; and a processor programmed to determine, using the mapping, the values of states of each of the devices corresponding to the received average of uniquely weighted states, determine, based on the values of states, a new value of the state of at least on device allowing to reroute distribution of the power; and command to the device to change the state to the new value.

According to aspects of the present disclosure, the information includes the mapping predetermined and stored in the memory, and wherein the processor retrieves the values of states of each of the devices from the predetermined mapping. The information includes the unique weights for states of each of the devices allowing to determine the mapping, and the processor is programmed to determine the mapping in response to receiving the average of uniquely weighted states.

Another aspect of the present disclosure can include the processor simulates an execution of a consensus protocol by the set of devices with different values of the uniquely weighted state of each device to determine the uniquely weighted states of the devices that result in the received average of uniquely weighted states, and determines the mapping from the determined uniquely weighted states of the devices.

Another aspect of the present disclosure can include each device comprises an input interface to accept an assigned unique number for each value of the state of the device; a device processor programmed to perform a consensus protocol; and an output interface to output estimations of the average of uniquely weighted states to reach the consensus with other devices in the set.

Another aspect of the present disclosure can include the weighted state of a device is defined by multiplying the state of the device with a factor, wherein the factor is defined using a unique multiplicity of total number of states of the device.

Another aspect of the present disclosure is that the power distribution network is partitioned into a set of areas, wherein each area has its own communication network to reach consensus on an average of uniquely weighted states of devices within the area. An overall topology model of the power distribution system is obtained by reaching an average of uniquely weighted states of areas through communications among areas.

Another aspect of the present disclosure is that each device comprises the communication network for an area of the power distribution network is established based on the topology of the power distribution network, and then enhanced by adding new links according to the given budget constraints for improving convergence performance and resilience to link failures. Wherein, the new links are selected from a set of possible new links ranked by a ranking index, wherein the ranking index is defined as a function of degrees of incident nodes of the link, degrees of immediate neighbors of the incident nodes, and the size of cycle formed after the link is established. wherein the new links must be not included in the base topology of the area, within a distance constrained by maximum communication range, and between two nodes with capacity for additional communication burden.

Another aspect of the present disclosure is that a topology of the communication network for the area is changed when a link failure presents, wherein the topology change may include an isolated node; wherein all links connected to the isolated node are failed. Wherein the isolated node is detected by computing the iterative switching status errors by run an average consensus protocol for each device sequentially. Wherein the weighted state for the corresponding device is set as its state multiplying by the total number of devices, and all other devices as zeros.

Another aspect of the present disclosure is that a new link is added to reconnect the isolated node to the communication network with a node with communication capacity to add new link, or replace with exiting link. Another aspect of the present disclosure is that the isolated node is removing from the list of devices, and run an average consensus for all the devices except the isolated node.

Another aspect of the present disclosure is that the node adjusts weights for links between the node and the neighbors of the node, when the total number of neighbors is changed due to an existing link disconnected, or a new link added. wherein the weight on a link is assigned based on the larger degree of two incident nodes of the link in real time, wherein the degree of a node is defined as a total number of immediate neighbors of the node.

Aspects of embodiments of present disclosure can further include a communication system is configured including a decoder formed by the control system of claim 1 and an encoder formed by the set of devices, wherein the encoder includes the set of devices in direct or indirect communication with each other, each device is configured to encode a state of the device with a weight associated with the state of the device and to engage in iterative communication exchange with devices in the direct communication with the device to reach a consensus on a function of an average of encoded states of the set of components, wherein the device uses different weights for different values of the state, and wherein at least some different devices have different weights for the same value of their states; and wherein the decoder is configured to store a mapping between values of the function of the average of the encoded states of the set of devices and un-encoded values of the states of the set of the devices, and to decode the states of the devices using the mapping upon receiving the function of the average of the encoded states from the encoder.

Figure 11:
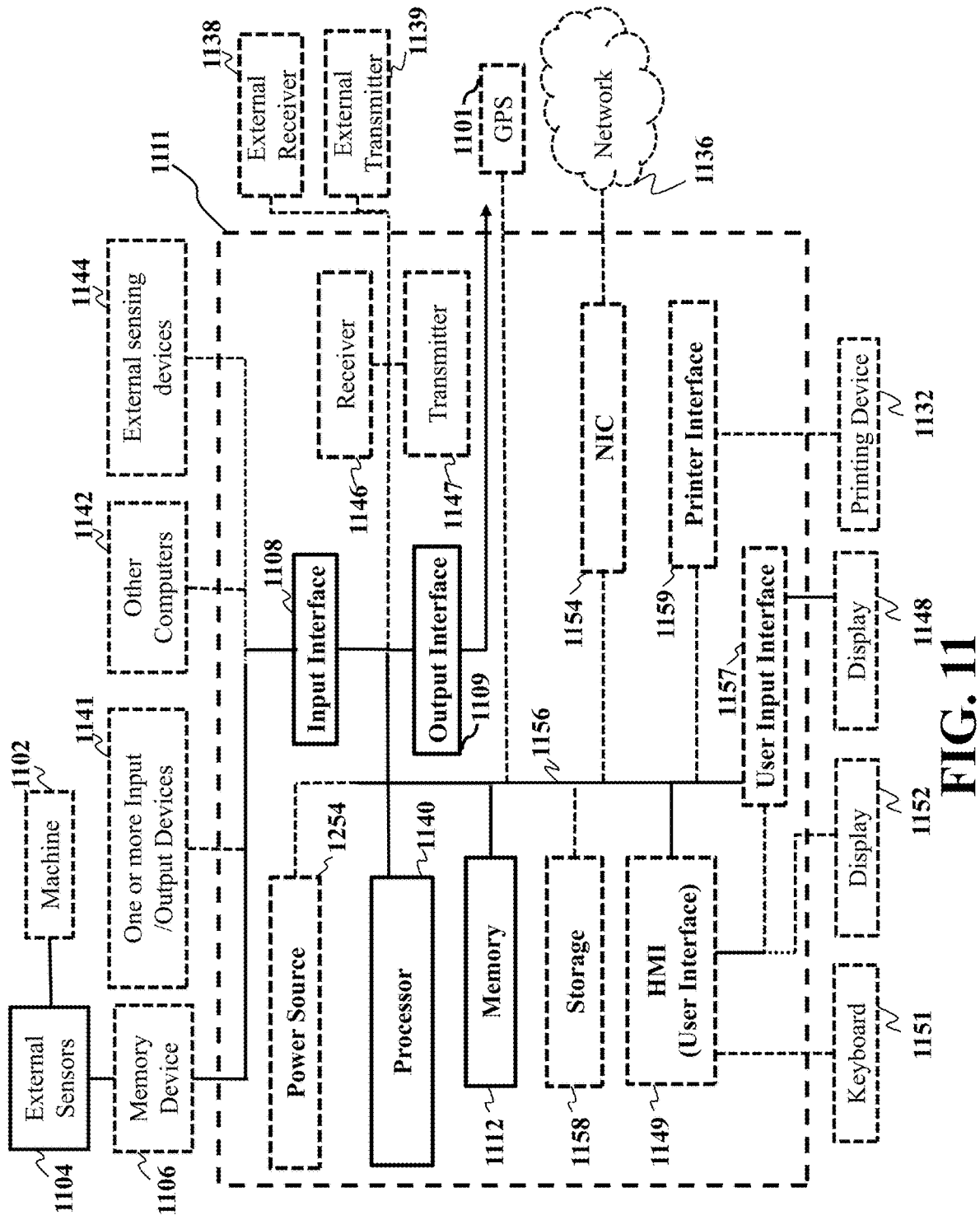
FIG. 11 is a block diagram illustrating the methods of FIG. 1A and FIG. 1B, that can be implemented using an alternate computer or processor, according to embodiments of the present disclosure.

FIG. 11 is a block diagram of illustrating the method of FIG. 1A, that can be implemented using an alternate computer or hardware processor, according to embodiments of the present disclosure. The computer 1111 includes a hardware processor 1140, computer readable memory 1112, storage 1158 and user interface 1149 with display 1152 and keyboard 1151, which are connected through bus 1156. For example, the user interface 1164 in communication with the hardware processor 1140 and the computer readable memory 1112, acquires and stores the signal data examples in the computer readable memory 1112 upon receiving an input from a surface, keyboard surface 1164, of the user interface 1164 by a user.

The computer 1111 can include a power source 1154, depending upon the application the power source 1154 may be optionally located outside of the computer 1111. Linked through bus 1156 can be a user input interface 1157 adapted to connect to a display device 1148, wherein the display device 1148 can include a computer monitor, camera, television, projector, or mobile device, among others. A printer interface 1159 can also be connected through bus 1156 and adapted to connect to a printing device 1132, wherein the printing device 1132 can include a liquid inkjet printer, solid ink printer, large-scale commercial printer, thermal printer, UV printer, or dye-sublimation printer, among others. A network interface controller (NIC) 1134 is adapted to connect through the bus 1156 to a network 1136, wherein time series data or other data, among other things, can be rendered on a third-party display device, third-party imaging device, and/or third-party printing device outside of the computer 1111.

Still referring to FIG. 11, the signal data or other data, among other things, can be transmitted over a communication channel of the network 1136, and/or stored within the storage system 1158 for storage and/or further processing. Contemplated is that the signal data could be initially stored in an external memory and later acquired by the hardware processor to be processed or store the signal data in the hardware processor's memory to be processed at some later time. The hardware processor memory includes stored executable programs executable by the hardware processor or a computer for performing the resilient restoration systems/methods, power distribution system operation data, and historical power distribution system data of the same type as the power distribution system and other data relating to the resilient restoration of the power distribution system or similar types of power distribution system s as the power distribution system.

Further, the signal data or other data may be received wirelessly or hard wired from a receiver 1146 (or external receiver 1138) or transmitted via a transmitter 1147 (or external transmitter 1139) wirelessly or hard wired, the receiver 1146 and transmitter 1147 are both connected through the bus 1156. The computer 1111 may be connected via an input interface 1108 to external sensing devices 1144 and external input/output devices 1141. For example, the external sensing devices 1144 may include sensors gathering data before-during-after of the collected signal data of the power distribution system. For instance, the disaster induced faulted line segments, and faulted types, and the fault impacted customers. The computer 1111 may be connected to other external computers 1142. An output interface 1109 may be used to output the processed data from the hardware processor 1140. It is noted that a user interface 1149 in communication with the hardware processor 1140 and the non-transitory computer readable storage medium 1112, acquires and stores the region data in the non-transitory computer readable storage medium 1112 upon receiving an input from a surface 1152 of the user interface 1149 by a user.

EMBODIMENTS

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments. Further, use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A control system for controlling a power distribution network including a set of devices for providing power, the devices include one or combination of a breaker, a recloser, and a sectionizing switch, and a tie-switch, the control system comprising:
   a transmitter configured to command the devices to reach a consensus on an average of uniquely weighted states of the devices based on iterative exchange of a uniquely weighted state of each device with its neighboring devices;
   a receiver configured to receive, in response to transmitting the command, the average of uniquely weighted states of the devices;
   a memory configured to store information indicative of a mapping between values of the average of uniquely weighted states of the devices and values of states of each of the devices; and
   a processor programmed to
      determine, using the mapping, the values of states of each of the devices corresponding to the received average of uniquely weighted states;
      determine, based on the values of states, a new value of the state of at least one device allowing to reroute distribution of the power; and
      command to the device to change the state to the new value, wherein the information includes the unique weights for states of each of the devices allowing to determine the mapping, wherein the processor is programmed to determine the mapping in response to receiving the average of uniquely weighted states, and wherein the processor is programmed to simulate an execution of a consensus protocol by the set of devices with different values of the uniquely weighted state of each device to determine the uniquely weighted states of the devices that result in the received average of uniquely weighted states, and determine the mapping from the determined uniquely weighted states of the devices.

2. The control system of claim 1, wherein the information includes the mapping predetermined and stored in the memory, and wherein the processor retrieves the values of states of each of the devices from the predetermined mapping.

3. The control system of claim 1, wherein each device comprises:
   an input interface to accept an assigned unique weight for each value of the state of the device;
   a device processor programmed to perform a consensus protocol to reach a consensus on a function of the average of uniquely weighted states of the devices, wherein the device uses different weights for different values of the state, and wherein at least some different devices have different weights for the same value of their states; and
   an output interface to output estimations of the average of uniquely weighted states to reach the consensus with other devices in the set.

4. The control system of claim 1, wherein the weighted state of a device is defined by multiplying the state of the device with a factor, wherein the factor is defined using a unique multiplicity of total number of states of the device.

5. The control system of claim 1, where the power distribution network is partitioned into a set of areas, wherein each area has its own communication network to reach consensus on an average of uniquely weighted states of devices within the area.

6. The control system of claim 5, where an overall topology model of the power distribution system is obtained by reaching an average of uniquely weighted states of areas through communications among areas.

7. The control system of claim 5, where the communication network for an area of the power distribution network is established based on the topology of the power distribution network, and then enhanced by adding new links according to the given budget constraints for improving convergence performance and resilience to link failures.

8. The control system of claim 7, wherein the new links are selected from a set of possible new links ranked by a ranking index, wherein the ranking index is defined as a function of degrees of incident nodes of the link, degrees of immediate neighbors of the incident nodes, and the size of cycle formed after the link is established.

9. The control system of claim 7, wherein the new links must be not included in the base topology of the area, within a distance constrained by maximum communication range, and between two nodes with capacity for additional communication burden.

10. The control system of claim 7, wherein a topology of the communication network for the area is changed when a link failure presents, wherein the topology change may include an isolated node; wherein all links connected to the isolated node are failed.

11. The control system of claim 10, wherein the isolated node is detected by computing the iterative switching status errors by run an average consensus protocol for each device sequentially.

12. The control system of claim 11, wherein the weighted state for the corresponding device is set as its state multiplying by the total number of devices, and all other devices as zeros.

13. The control system of claim 10, wherein a new link is added to reconnect the isolated node to the communication network with a node with communication capacity to add new link, or replace with exiting link.

14. The control system of claim 10, wherein the isolated node is removing from the list of devices, and run an average consensus for all the devices except the isolated node.

15. The control system of claim 10, wherein the node adjusts weights for links between the node and the neighbors of the node, when the total number of neighbors is changed due to an existing link disconnected, or a new link added.

16. The control system of claim 15, wherein the weight on a link is assigned based on the larger degree of two incident nodes of the link in real time, wherein the degree of a node is defined as a total number of immediate neighbors of the node.

17. A method for controlling a power distribution network including a set of devices for providing power, the devices include one or combination of a breaker, a recloser, and a sectionizing switch, and a tie-switch, wherein the method uses a processor coupled with stored instructions implementing the method, wherein the instructions, when executed by the processor carry out steps of the method, comprising:

commanding the devices to reach a consensus on an average of uniquely weighted states of the devices based on iterative exchange of a uniquely weighted state of each device with its neighboring devices, wherein the power distribution network is partitioned into a set of areas, wherein each area has its own communication network to reach consensus on an average of uniquely weighted states of devices within the area, and wherein the communication network for an area of the power distribution network is established based on the topology of the power distribution network, and then enhanced by adding new links according to the given budget constraints for improving convergence performance and resilience to link failures;

receiving, in response to transmitting the command, the average of uniquely weighted states of the devices;

retrieving information indicative of a mapping between values of the average of uniquely weighted states of the devices and values of states of each of the devices;

determining, using the mapping, the values of states of each of the devices corresponding to the received average of uniquely weighted states;

determining, based on the values of states, a new value of the state of at least one device allowing to reroute distribution of the power; and commanding to the device to change the state to the new value.

18. A non-transitory computer readable storage medium embodied thereon a program executable by a processor for performing a method for controlling a power distribution network including a set of devices for providing power, the devices include one or combination of a breaker, a recloser, and a sectionizing switch, and a tie-switch, the method comprising:

commanding the devices to reach a consensus on an average of uniquely weighted states of the devices based on iterative exchange of a uniquely weighted state of each device with its neighboring devices, wherein the power distribution network is partitioned into a set of areas, wherein each area has its own communication network to reach consensus on an average of uniquely weighted states of devices within the area, and wherein the communication network for an area of the power distribution network is established based on the topology of the power distribution network, and then enhanced by adding new links according to the given budget constraints for improving convergence performance and resilience to link failures;

receiving, in response to transmitting the command, the average of uniquely weighted states of the devices;

retrieving information indicative of a mapping between values of the average of uniquely weighted states of the devices and values of states of each of the devices;

determining, using the mapping, the values of states of each of the devices corresponding to the received average of uniquely weighted states;

determining, based on the values of states, a new value of the state of at least one device allowing to reroute distribution of the power; and commanding to the device to change the state to the new value.

* * * * *